(12) United States Patent
Hirai et al.

(10) Patent No.: US 7,771,246 B2
(45) Date of Patent: Aug. 10, 2010

(54) METHOD OF FORMING FILM PATTERN, FILM PATTERN, DEVICE, ELECTRO OPTIC DEVICE, AND ELECTRONIC APPARATUS

(75) Inventors: Toshimitsu Hirai, Chino (JP); Katsuyuki Moriya, Azumino (JP); Shinri Sakai, Suwa (JP)

(73) Assignee: Seiko Epson Corporation (JP)

( * ) Notice: Subject to any disclaimer, the term of this patent is extended or adjusted under 35 U.S.C. 154(b) by 977 days.

(21) Appl. No.: 11/382,555

(22) Filed: May 10, 2006

(65) Prior Publication Data

US 2006/0255720 A1    Nov. 16, 2006

(30) Foreign Application Priority Data

May 11, 2005    (JP) ............................. 2005-138095

(51) Int. Cl.
*H01J 9/00* (2006.01)
*H01J 1/62* (2006.01)
(52) U.S. Cl. .......................... 445/24; 313/506; 313/509
(58) Field of Classification Search ......... 313/498–512; 445/24
See application file for complete search history.

(56) References Cited

U.S. PATENT DOCUMENTS

| 2005/0024431 A1* | 2/2005 | Miura et al. ................... 347/47 |
| 2005/0064633 A1* | 3/2005 | Mikoshiba ................... 438/151 |
| 2005/0082966 A1* | 4/2005 | Yamazaki et al. ............ 313/498 |

FOREIGN PATENT DOCUMENTS

| JP | 2004-146796 | 5/2004 |
| JP | 2004-363560 | 12/2004 |

* cited by examiner

*Primary Examiner*—Bumsuk Won
(74) *Attorney, Agent, or Firm*—Harness, Dickey & Pierce, P.L.C.

(57) ABSTRACT

A method of forming a film pattern by placing a functional liquid on a substrate, comprises:
  forming a bank on the substrate, wherein the bank corresponds to a region for forming the film pattern;
  placing the functional liquid in the region for forming the film pattern partitioned by the bank; and
  curing the functional liquid to form the film pattern;
  wherein the functional liquid is placed under conditions that a difference between an advancing contact angle and a receding contact angle of the functional liquid with a top surface of the bank is 10 degrees or more and that the receding contact angle is 13 degrees or more.

10 Claims, 14 Drawing Sheets

| INK MATERIAL | POLYMETHYLSILOXANE | | | DECISION RESULT | PLASMA PROCESSING POLYMETHYLSILOXANE | | | DECISION RESULT |
|---|---|---|---|---|---|---|---|---|
| | θ | θa | θr | | θ | θa | θr | |
| Ag INK (WATER-BASED DISPERSION MEDIUM) | 43.0 | 46.0 | 20.2 | POSSIBLE | 72.8 | 76.0 | 14.3 | POSSIBLE |
| Ag INK (HYDROCARBON-BASED DISPERSION MEDIUM) | 15.0 | 18.0 | 1.6 | IMPOSSIBLE | 44.0 | 47.0 | 9.0 | IMPOSSIBLE |
| TETRADECANE | 24.0 | 23.0 | 13.0 | POSSIBLE | 66.1 | 74.3 | 1.0 | IMPOSSIBLE |
| 1-OCTANOL | 8.0 | 24.0 | 8.3 | INCAPABLE | 63.6 | 70.7 | 16.0 | POSSIBLE |

FIG.10

METHOD OF FORMING FILM PATTERN, FILM PATTERN, DEVICE, ELECTRO OPTIC DEVICE, AND ELECTRONIC APPARATUS

BACKGROUND OF THE INVENTION

1. Technical Field

The present invention relates to a method of forming a film pattern, a film pattern, a device, an electro optic device, and an electronic apparatus.

2. Related Art

A semiconductor device (device) has been formed hitherto such that circuit wiring in which a thin film pattern (film pattern) composed of a conductor is disposed, an insulating film and the like to cover the circuit wiring, and a semiconductor layer are stacked on a substrate. As a method of forming this thin film pattern, a so-called inkjet method is known, in which a droplet of a functional liquid containing a material for forming a film as a solute is discharged from a droplet discharging head, and the functional liquid that has landed is dried so that the solvent is removed from the functional liquid, thereby forming a thin film pattern. In the inkjet method, a recess having the same planar shape as the thin film pattern is formed by forming a bank on a substrate so as to surround a region in which a thin film is to be formed. Further a functional liquid is discharged towards the recess and then the functional liquid that has landed on the recess is dried, and as a result, a desired thin film pattern can be formed.

In recent years, as the density of a circuit constituting a semiconductor device has become higher, for example, there has also been demands for finer wiring and thinner wires. To meet the demands, it is proposed that a functional liquid is discharged into a region for wiring formation partitioned by a bank with the fine width by the above inkjet method so as to form fine wiring.

At this point, it is desirable that a functional liquid be selectively discharged (placed) into the wiring foundation region alone. There is therefore a technique where a lyophobic treatment is performed for the surface of a bank to partition the wiring formation region mentioned above, and a lyophilic treatment is performed for the other parts, for example, the top of a substrate that will be the wiring formation region. When a functional liquid is discharged into the above wiring formation region, the entire functional liquid is poured into the wiring formation region even though part of the functional liquid is discharged into the top surface of the bank. Fine wiring (film pattern) is thereby formed.

Here, if the difference in the wettability (affinity) to the functional liquid is small between the lyophobic part for which a lyophobic treatment has been performed and the lyophilic part for which a lyophilic treatment has been performed, droplets placed on a bank might be repelled outside the bank not to spread in a wet state in the above wiring formation region. There is therefore a technique where the difference in contact angle with the functional liquid between the bank (lyophobic part) and the substrate (lyophilic part) is 40 degrees or more so that droplets that have landed on the bank reliably spread in a wet state in the above wiring formation region (see JP A-2004-363560, for example).

With the control of the contact angle as described above alone, however, when a droplet is discharged onto the bank and poured into the wiring formation region (pattern formation region) partitioned by the bank, a trace of the droplet landing still remains on the bank. At this point, if the functional liquid has conductivity, the landing trace of the droplet on the bank also has conductivity causing the wiring in the wiring formation region to be conductive with the landing trace. Then, contact with the landing trace on the bank might result in a short-circuit between wires formed adjacent with each other. The reliability of the wiring would therefore be reduced.

SUMMARY

In view of the above situation, the present invention is to provide a method of forming a film pattern in which a functional liquid landing on a bank is reliably poured into a pattern formation region without the residue of the functional liquid remaining on the bank so as to obtain a film pattern with high reliability to provide a film pattern obtained by this formation method, and to provide, a device, an electro optic device, and an electronic apparatus including this film pattern.

The inventor diligently studied the above issues towards the resolution and as a result, had knowledge that the receding contact angle of the functional liquid with the bank was related to whether the landing trace of the functional liquid remained on the bank.

The inventor completed the present invention based on such knowledge.

According to an aspect of the invention, a method of forming a film pattern by placing a functional liquid on a substrate, comprises: forming a bank on the substrate, wherein the bank corresponds to a region for forming the film pattern; placing the functional liquid in the region for forming the film pattern partitioned by the bank; and curing the functional liquid to form the film pattern; wherein the functional liquid is placed under conditions that a difference between an advancing contact angle and a receding contact angle of the functional liquid with a top surface of the bank is 10 degrees or more and that the receding contact angle is 13 degrees or more.

In the method of forming a film pattern according to an aspect of the invention, the functional liquid is placed under the conditions that the difference between the advancing contact angle and the receding contact angle of the functional liquid with the top surface of the bank is 10 degrees or more and that the receding contact angle is 13 degrees or more. As seen from the experimental results to be described later, for example, if the functional liquid lands on the bank, the functional liquid can be poured into the pattern formation region without the landing trace of the functional liquid remaining on the bank. If the film pattern formed in the pattern formation region is employed as wiring; a short circuit caused by contact between wiring adjacently located can be prevented since the residue of the functional liquid on the bank is prevented from remaining. Thus, according to an aspect of the invention, the functional liquid is reliably poured into the pattern formation region, and thereby a film pattern with high reliability can be formed.

Further, in the above method of forming a film pattern, it is preferable that the functional liquid be placed under the condition that a static contact angle of the functional liquid with the top surface of the bank is 20 degrees or more.

If the static contact angle of the functional liquid with the top surface of the bank is too small, the functional liquid spreads in a wet state on the bank upon landing on the bank. Therefore, there are some cases where the functional liquid is not appropriately poured into the above pattern formation region. Employing the invention makes it possible to appropriately pour the functional liquid landing on the top surface of the bank into the pattern formation region by providing lyophobicity having a static contact angle of the functional liquid of 20 degrees or more.

Further, in the above method of forming a film pattern, it is preferable that the bank be formed by the following processes. Namely, a photosensitive polysilazane liquid or a photosensitive polysiloxane liquid including a photoacid generator and functioning as a positive photo resist is coated, exposed, developed, patterned, and then burned, forming a bank made of a material mainly composed of a siloxane bond.

The formed bank has high resistance to heating since the formed bank is inorganic. Therefore, for example, if it is necessary to heat the functional liquid at relatively high temperatures in curing it, the bank can be sufficiently resistant to heating without bringing disadvantages such as being molten. These processes secure better accuracy of patterning the bank since a polysilazane liquid or a photosensitive polysiloxane liquid functions as a positive photo resist. Therefore, a film pattern obtained from the liquid can have better accuracy, and can preferably be adopted when fine wiring is formed.

Further, in the above method of forming a film pattern, it is preferable that the functional material included in the functional liquid be a conductive material.

Here, for example, if the functional liquid is a conductive material including conductive micro particles, the film pattern to be formed can be provided with conductivity, and the formed film pattern can be formed as wiring.

Further, in the above method of forming a film pattern it is preferable that the functional liquid included a main material bearing the main function of the film pattern to be formed and a material for improving adhesion between the main material and the substrate.

This prevents a second functional material bearing the main function of the film pattern from being removed from the substrate by a first functional material.

In addition, the second functional material in the invention is a material having the main function of the film pattern. For example, if the film pattern is formed as wiring, the second functional material is silver and copper mainly bearing the function of flowing a current. As the first functional material, chrome, manganese, iron, nickel, molybdenum, titanium, and tungsten can be mentioned.

Further, the above method of forming a film pattern, it is preferable that the functional liquid include a main material bearing the main function of the film pattern to be formed and a material for suppressing electromigration of the main material.

This functional liquid can suppress electromigration, for example, if the film pattern is used as wiring.

Here, electromigration is a phenomenon that atoms migrate along the flow of electrons by passing a current through wiring for a long time, causing an increase of the value of resistance and disconnection. Titanium and other substances are mentioned as the material suppressing electromigration.

Further, in the above method of forming a film pattern, it is preferable that the functional liquid include a main material bearing the main function of the film pattern to be formed and a material having insulating characteristics.

This functional liquid makes it possible for the material having insulating characteristics to function as an insulating layer when the film pattern is employed as wiring, for example.

Further, in the above method of forming a film pattern, it is preferable that the functional liquid include a main material bearing the main function of the film pattern to be formed and a material for suppressing plasma damage of the main material.

This functional liquid can suppress the plasma damage by CVD and the plasma damage to the main material of the film pattern in performing a lyophobic process for the bank by plasma press method ($CF_4$ plasma processing method) using carbon tetrafluoride (tetrafluoromethane) as the processing gas. Thus, plasma processing can preferably be employed in this method of forming a film pattern.

In this case, a material for suppressing the plasma damage to the main material is preferably a barrier material for suppressing diffusion due to the plasma damage.

This material can prevent a leakage current from being generated by diffusion of metal ion in an interlayer insulating film if the film pattern is used as metal wiring.

A film pattern of the invention is formed by the above method of forming a film pattern.

The functional liquid is reliably poured into the edge of the bank as described above, forming the film pattern of the invention in a desired shape. Hence, the film pattern of the invention has high reliability.

According to a device of the invention, it is provided with the above film pattern.

This device cam perform appropriate operations and is highly reliable since it is provided with the film pattern with high reliability as described above, for example, as wiring connected to a switching element.

According to an electro optic device of the invention, it is provided with the above device.

This electro optic device provided with the above device can be reliably driven because of the above-mentioned device.

According to an electronic apparatus of the invention, it is provided with the above electro optic device.

This electronic apparatus can display appropriately since the above-mentioned electro optic device with high reliability is used as the display section of the electronic apparatus.

BRIEF DESCRIPTION OF THE DRAWINGS

The invention will now be described with reference to the accompanying drawings, wherein like numbers refer to like elements.

FIG. 10 is a table showing experimental results.

DESCRIPTION OF THE EMBODIMENTS

Figure 1:
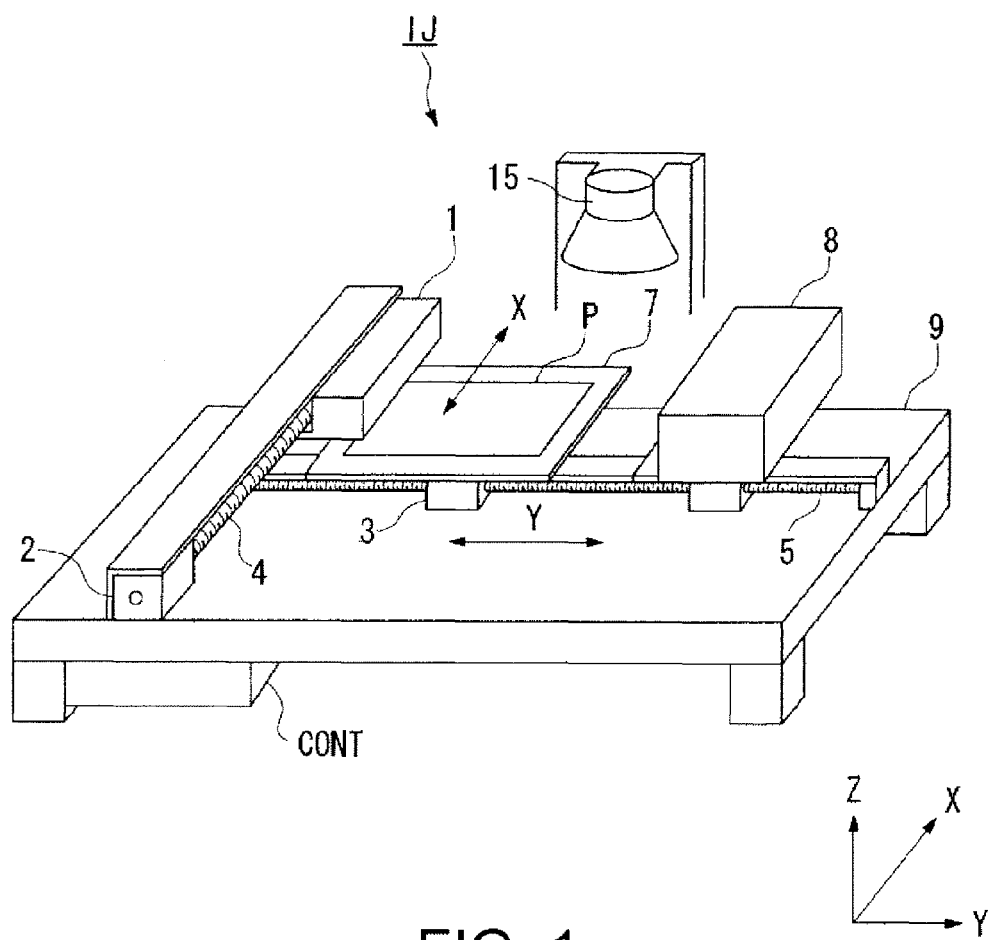
FIG. 1 is a perspective view of a droplet discharging device IJ.

The embodiments of the invention are explained referring to figures. Here, in each of figures, contraction scales of layers and parts may be different so as to have recognizable size on each of figures.

First Embodiment

First, an embodiment a droplet discharging method as the method of forming a film pattern of the invention is explained. In this method, ink (functional liquid) for a wiring pattern (film pattern) containing conductive micro particles discharged as droplets from a nozzle of a droplet discharging head so as to form a wiring pattern (film pattern) between the banks formed on the substrate corresponding to the wiring pattern, namely, in the region partitioned by the banks. In this embodiment, in particular, two different kinds of functional liquid are discharged to form a wiring pattern (film pattern) composed of a plurality of materials stacked one over another.

Regarding the ink (functional liquid) for wiring patterns, a liquid containing a water-based dispersion medium or solvent is particularly used when a material based on polysiloxane, which is water repellent, such as polymethylsiloxane is used for a bank, as described later. Specifically, a dispersion liquid containing conductive micro particles dispersed in a water-based disperse medium such as water, alcohol or the like, or a dispersion liquid containing an organic silver compound or silver oxide nanoparticles dispersed in a water-based disperse medium is used. Various combinations of the above-described bank and the above-described ink for wiring pattern can be chosen if the ink can be placed under the conditions that the difference between the advancing contact angle and receding contact angle of the ink with the top surface of the bank is 10 degrees or more and that the receding contact angle is 13 degrees or more, which will be described later.

In this embodiment, as conductive micro particles, metal micro particles containing any one of gold, silver, copper, iron, chromium, manganese, molybdenum, titan, palladium, tungsten, and nickel, these oxides, and micro particles of conductive polymers and superconductors are used.

The surface of these conductive micro particles may be covered with an organic material for improvement of the dispersion.

The diameter of a conductive micro particle is not less than 1 nm nor 0.1 μm. If the diameter is larger than 0.1 μm, particles may clog the nozzle of the droplet discharging head to be described later. On the other hand, when the size is less than 1 nm, the volume ratio of coating material to the conductive micro particles becomes large and the ratio of organic material in the obtained film becomes too much.

Although description on this embodiment is given using a water-based solvent, a solvent is not specifically limited if it can disperse the conductive micro particles. Such dispersion medium and/or solvents are water, and in addition thereto, alcohol such as methanol, propanol, and butanol; carbon hydride compounds such as n-heptane, n-octane, decane, dodecane, tetradecane, toluene, xylene, cymene, durren, inden, dipenten, tetydro naphthalene, decahydro naphthalene, and cyclohexyl benzen; and eter compounds such as ethleneglycol dimethyl eter, ethleneglycol diethyl eter, ethleneglycol methyl ethyl eter, diethleneglycol dimethyl eter, diethleneglycol diethyl eter, diethleneglycol methyl ethyl eter, 1,2-dimethoxy ethane, bis(2-methoxy ethyl) eter, and p-dioxane; and further polar compounds such as propylene carbonate, γbutyrolactone, N-methyl-2-pyrrolidone, dimethyl formamide, dimethyl sulfoxide, and cyclohexanone. Water, alcohol, carbon hydride compounds, and ether compounds among them are preferable in view of dispersion of micro particles, stable solution, ease of use for a droplet discharging method (inkjet method). In particular, water and carbon hydride compounds are more preferable as a dispersion medium or solvent.

The surface tension of the dispersion liquid including conductive micro particles is preferably in the range not less than 0.02 N/m nor more than 0.07 N/m. If the surface tension is less than 0.02 N/m, droplets easily veeringly fly when droplets are discharged by an inkjet method since the wettability of ink compounds to the discharging nozzle surface increases. On the other hand, if the surface tension is more than 0.07 N/m, it becomes difficult to control the amount of discharging and timing of it since the configuration of meniscus becomes unstable at the nozzle edge. In order to control the surface tension, a small amount of fluorine, silicone, or nonion materials for controlling the surface tension may be added to a liquid material as well as avoiding a substantial decrease of the contact angle with the surface of the substrate. A nonion material for controlling the surface tension improves the wettability of the liquid material to the substrate and the leveling property of the film, preventing the coated film from having fine uneven surfaces. Materials for control the surface tension may include organic compounds such as alcohol, ether, ester, and ketene if they are necessary.

The viscosity of the dispersion liquid is preferably not less than 1 mPa.s nor more than 50 mPas. If the viscosity of the liquid is less than 1 mPa.s, the periphy of the nozzle is easily contaminated with a flowed ink when a liquid material is discharged as droplets by an inkjet method. On the other hand, if the viscosity of the liquid is more than 50 mPa.s, the nozzle hole is easily clogged, making it difficult to smoothly discharge droplets.

Various materials such as glass, quartz glass, a silicon wafer, a plastic film, and a metal board can be used as the substrate on which a wiring pattern is formed. Substrates that use these materials and on which a semiconductor film, a metal film, a dielectric film, an organic film, or the like is formed as the underlying layer are also included in the substrate for a wiring pattern.

Here, an electrification control method, a pressure vibration method, an electromechanical conversion method, an electrothermal conversion method, and an electrostatic suction method are cited as discharging techniques of the droplet discharging method. The electrification control method is a technique in which a charge electrode applies a charge to a material and a deflecting electrode controls the flying direction of the material so that the material is discharged from a discharging nozzle. In the pressure vibration method, a ultrahigh pressure of about 30 kg/cm$_2$ is applied to a material so that the material is discharged to the nozzle tip side. If no control voltage is applied to a material, the material moves straight to be discharged from the discharging nozzle. On the other hand, if a control voltage is applied, electrostatic repulsion occurs among particles of the material, and the material is scattered not to be discharged from the discharging nozzle. The electromechanical conversion method utilizes the property that a piezo element (piezoelectric element) deforms when receiving a pulsed electrical signal. By deformation of the piezo element, a pressure is applied through a flexible member to a space where a material is contained, and as a result, the material is ejected from the space to be discharged from the discharging nozzle.

In the electrothermal conversion method, the material is rapidly vaporized to create bubbles by a heater provided in the space containing the material and is ejected from the space by the pressure of the bubbles. In the electrostatic suction method, a small amount of pressure is applied to the inside of the space where the material is contained to form a meniscus of the material at the discharging node, and in this state electrostatic suction is applied to draw out the material. Additionally, other techniques such as a method of utilizing changes in viscosity of a fluid depending on the electric field and a method of spraying a droplet by a spark can be applied. The droplet discharging method has advantages in that it has little waste in material use and a desired amount of material can be accurately placed at a desired location. The mass of one droplet of liquid material (fluid) discharged by the droplet discharging method is, for example, 1 to 300 nanograms.

In this embodiment, a droplet discharging device (inkjet device) using a piezo element (piezoelectric element) of the electromechanical conversion method is used as a device for discharging droplets as described above.

FIG. 1 is a perspective view illustrating a schematic structure of a droplet discharging device IJ.

The droplet discharging device IJ comprises a droplet discharging head 1, a driving shaft for the X-axis direction 4, a guiding shaft for the Y-axis direction 5, a controller CONT, a stage 7, a cleaning mechanism 8, a base 9, and a heater 15.

The stage 7 supports the substrate P, which receives a liquid material (ink for wiring pattern) from the droplet discharging device IJ and includes a fixing mechanism (not shown in the figure) to fix the substrate P to the reference position.

The droplet discharging head 1 is provided with a plurality of discharging nozzles as a multiple-node type and its longitudinal direction is coincided with the X-axis direction The plurality of discharging nozzles spaced at regular intervals are provided on the undersurface of the droplet discharge head 1. Ink for wiring pattern containing the above-described conductive micro particles is discharged from the discharging nozzle of the droplet discharging head 1 to the substrate P supported by the stage 7.

A driving motor for the X-axis direction 2 is connected to the driving shaft for the X-axis direction 4. The X axis direction drive motor 2 is a stepping motor or the like and rotates the driving shaft for the X-axis direction 4 when a drive signal in the X axis direction is supplied from the controller CONT. When the driving shaft for the X-axis direction 4 is rotated, the droplet discharging head 1 is moved in the X axis direction.

The guiding shaft for the Y-axis direction 5 is fixed not to move with respect to the base 9. The stage 7 is provided with a driving motor for the Y-axis direction 3. The driving motor for the Y-axis direction 3 is a stepping motor or the like that moves the stage 7 in the Y axis direction when a drive signal in the Y axis direction is supplied from the controller CONT.

The controller CONT supplies a voltage to the droplet discharging head 1 to control discharging of droplets. It also supplies a drive pulse signal to the driving motor for the X-axis direction 2 to control movement of the droplet discharging head 1 in the X axis direction, and supplies a drive pulse signal to the driving motor for the Y-axis direction 3 to control movement of the stage 7 in the Y axis direction.

The cleaning mechanism 8 cleans the droplet discharging head 1. The cleaning mechanism 8 is provided with a driving motor in the Y axis direction (not shown). The cleaning mechanism is driven to move along the guiding shaft for the Y-axis direction 5 by the Y axis direction driving motor. The movement of the cleaning mechanism 8 is also controlled by the controller CONT.

The heater 15 is used here as a means for heat treatment of the substrate P by lamp annealing, and performs evaporation and drying of a solvent contained in a liquid material provided on the substrate P. Power on and off of the heater 15 is also controlled by the controller CONT.

The droplet discharging device IJ discharges droplets onto the substrate P from a plurality of discharging nozzles arranged in the X axis direction on the undersurface of the droplet discharging head 1 while relatively scanning the droplet discharging head 1 and the stage 7 supporting the substrate P.

Figure 2:
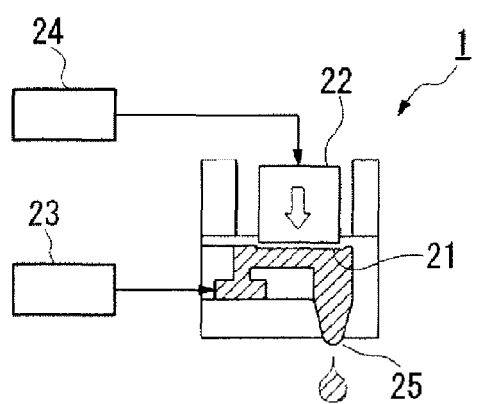
FIG. 2 is a diagram for explaining the principle of discharging a liquid material based on a piezo method.

FIG. 2 is a digram for explaining the principle of discharging a liquid material based on a piezo method.

In FIG. 2, a piezo element 22 is placed adjacent to a liquid chamber 21 storing a liquid material (ink for wiring pattern, functional liquid). A liquid material is supplied to the liquid chamber 21 through a liquid material supplying system 23 including a material tank that stores the liquid material. The piezo element 22 is coupled to a drive circuit 24, through which a voltage is applied to the piezo element 22 so as to deform the piezo element 22. The deformation of the piezo element 22 causes deformation of the liquid chamber 21, and thereby a liquid material is discharged from a discharging nozzle 25. In this case, the deformation amount of the piezo element 22 is controlled by varying the applied voltage, and its deformation velocity of the piezo element 22 is controlled by varying the frequency of the applied voltage. The droplet discharging based on a piezo method does not add heat to a material and therefore has an advantage of having little effect on the composition of the material.

Figure 3A:
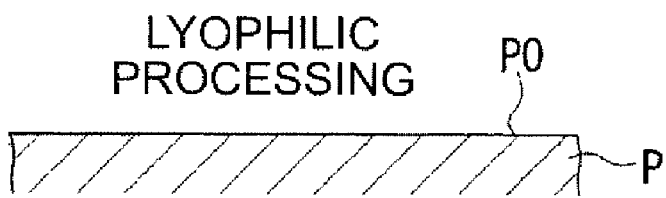
FIGS. 3A to 3D are views for explaining a method of forming a wiring pattern according to the invention in the order of processes.

In the embodiment, a bank corresponding to the wiring pattern is formed on the substrate a described above. Prior to this information, a lyophilic treatment is performed for the substrate. The lyophilic treatment is performed so as to make the wettability of the substrate P to the discharged ink good when ink (functional liquid) is placed by discharging as described later. For example, as shown in FIG. 3A, a film with big lyophilicity (hydrophilicity) $P_0$ such as TiO2 is formed on the surface of the substrate P. Alternatively, hexamethyldisilazane (HMDS) in a steam state may be adhered onto the surface to be processed of the substrate P (HMDS process) so as to form the film with lyophilicity $P_0$. The surface of the substrate P may also be made rough so as to exhibit lyophilicity.

Forming Bank

When the lyophilic treatment has been performed as described above, a bank is formed on the substrate P. The bank formed in the embodiment is the same as used in an example of experiment to be described later.

Figure 3B:

The bank can function as a partitioning part and can be formed by an arbitrary method such as a lithography method or a printing method. For example, if a lithography method is used, a material for forming a bank, for example, a polysilazane liquid in the embodiment is applied onto the substrate P in accordance with a predetermined bank height by a predetermined method such as spin coating, spray coating, roll coating, die coating, or dip coating, forming a polysilazane thin film 31, as shown in FIG. 3B.

Here, as the polysilazane liquid used as the material for forming a bank, a polysilazane liquids mainly composed of polysilazane, particularly a photosensitive polysilazane liquid including polysilazane and a photoacid generator is preferably used. The photosensitive polysilazane liquid functions as a positive photo resist, which is directly patterned through exposure and development processes. JPA 2002-72 discloses examples of the photosensitive polysilazane. Further, JPA 2002-72504 also discloses examples of the photoacid generator included in the photosensitive polysilazane. In addition, a photosensitive polysiloxane liquid may be used as the material for forming a bank.

If is polysilazane is, for example, polymethylsilazane as shown in the following formula (1), part of this polysilazane is hydrolyzed as shown in the following formula (2) or (3) by humidification as described later. Further, this hydrolyzed polysilazane becomes polymethylsiloxane [—$(SiCH_3O_{1.5})n$—] with condensation as shown in the following formulas (4) to (6) by heating at a temperature less than 400° C. In the following formulas (2) to (6), only basic element units (repeated units) are shown by simplifying chemical formulas in order to explain reaction mechanisms.

The polymethylsiloxane formed in this manner is mainly composed of polysiloxane and has a methyl group, which is a hydrophobic group, as its side chain. Therefore, it has high resistance against heating, since its main component is inorganic. It also has good repellency by itself since it has a methyl group, which is a hydrophobic group, as its side chain. However, there is a problem not shown in the chemical formulas. If it is heated at a temperature of 400° C. or more, the methyl group, the side chain, is removed from it. As a result, it becomes polysiloxane, which has remarkably reduced repellency. Thus, the heating temperature is preferably less than 400° C. in the invention particularly when a bank is formed from a polysilazane liquid.

Formula (1): $(SiCH_3(NH)_{1.5})n$—

Formula (2): $SiCH_3(NH)_{1.5}+H_2O \rightarrow SiCH_3(NH)(OH)+0.5NH_3$

Formula (3): $SiCH_3(NH)_{1.5}+2H_2O \rightarrow SiCH_3(NH)_{0.5}(OH)_2+NH_3$

Formula (4): $SiCH_{3(NH)(OH)+SiCH3}(NH)(OH)+H_2O \rightarrow 2SiCH_3O_{1.5}+2NH_3$ Formula (5): $SiCH_3(NH)(OH)+SiCH_3(NH)_{0.5}(OH)_2 \rightarrow 2SiCH_3O_{1.5}+1.5NH_3$ Formula (6): $SiCH_3(NH)_{0.5}(OH)_2+SiCH_3(NH)_{0.5} \rightarrow 2SiCH_3O_{1.5}+2NH_3+H_2O$ Subsequently, the obtained polysilazane thin film 31 is preliminarily baked at a temperature of 110° C. for about 1 minute on a hot plate, for example.

Figure 3C:
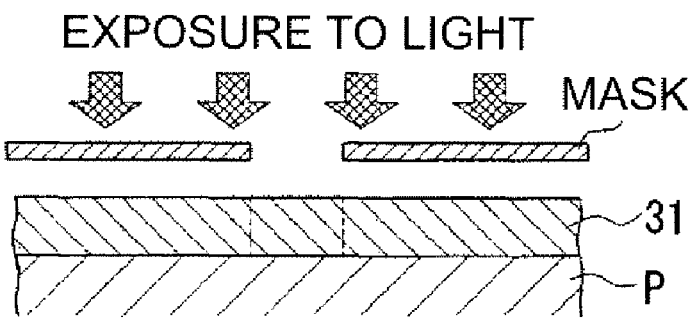

Next, the polysilazane thin film 31 is exposed to light using a mask as shown in FIG. 3C. At this point, portions to be removed by the later development process are selectively exposed to light since the polysilazane thin film 31 functions as a positive photo resist as described above. The light source for exposure is appropriately selected and used in considering the composition and photosensitive characteristics of the above-described photosensitive polysilazane liquid from a high pressure mercury lamp, a low pressure mercury lamp, a metal halide lamp, a xenon lamp, an excimer laser, X-rays, and electron beams, which are used for existing exposure of a photoresist. The amount of energy of irradiating light depends on the light source and the film thickness, but is usually 0.05 mJ/cm$^2$ or more, and desirably 0.1 mJ/cm$^2$ or more. There is no particular uppermost limit on the amount of energy, but it is impractical with regard to the processing time to set too much amount of energy. Thus the amount of energy is usually 10000 mJ/cm$^2$ or less. Exposure to light may be performed in an ambient (in an atmospheric air) or a nitrogen ambient, and an ambient having an enriched oxygen content may also be employed in order to facilitate decomposition of polysilazane.

In the photosensitive polysilazane thin film 31 containing a photoacid generator, acid is selectively generated particularly in its exposed portion by the above-described light exposure, breaking Si—N bonding of polysilazane. Reacting with moisture in the ambient, part of the polysilazane thin film 31 is hydrolyzed as shown in the above formula (2) or (3) by humidification. Finally, a silanol (Si—OH) bond is generated and polysilazane is decomposed.

Figure 3D:
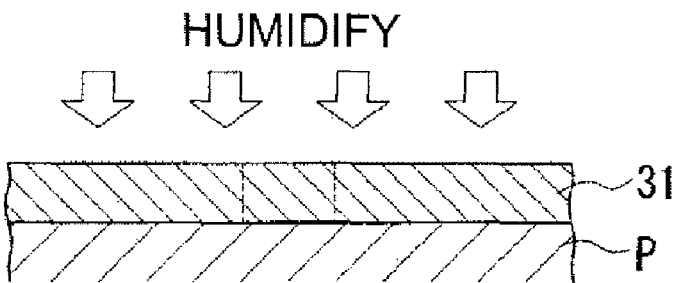

Next, in order to further facilitate generation of a silanol (Si—OH) bond and decomposition of polysilazane, the polysilazane thin film 31 after exposed to light is humidified for about 4 minutes under the conditions of a temperature of 25° C. and a relative humidity of 80% as shown in FIG. 3D. By continuously supplying moisture into the polysilazane thin film 31, acid that once contributed to breaking the Si—N bond of polysilazane functions repeatedly as a medium for breaking. This Si—OH bonding occur while the film is exposed to light, and is further facilitated by humidifying the exposed film after exposure to light.

The higher the humidity in the processing ambient of humidification is, the faster the speed of generation of the Si—OH bond can be. However, if the speed is too fast, there is a possibility of dew condensation on the surface of a film. In this view, the relative humidities of 90% or less are practical. Regarding such humidification, a gas containing moisture may be contacted with the polysilazane thin film 31. Accordingly, the exposed substrate P may be placed in a humidification device, to which a gas containing moisture is continuously introduced. The exposed substrate P may also be placed and left for a predetermined period in a humidification device in which the humidity has already been controlled by introducing a gas containing moisture into the device beforehand.

Figure 4A:
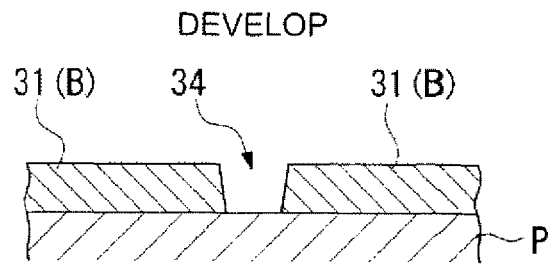
FIGS. 4A to 4E are views for explaining a method of forming a pattern according to the invention in the order of processes.

Next, the polysilazane thin film 31 after humidified is developed at a temperature of 25° C. by a tetramethylammonium hydroxide (TMAH) liquid having a concentration of 2.38%, for example, to selectively remove the exposed portion, making the polysilazane thin film 31 in a desired bank configuration as shown in FIG. 4A. Thus, banks B are formed in correspondence to a region for forming an intended film pattern and at the same time a film pattern formation region 34, for example, in a groove shape is formed. Alkaline developers other than TMAH, such as choline, sodium silicate, sodium hydroxide, and potassium hydroxide can be used as a developer.

Figure 4B:
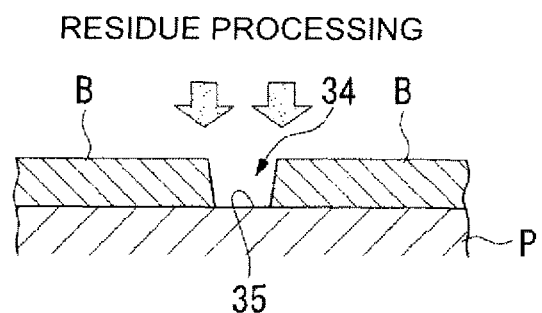

Next, after the film is rinsed as needed, residue processing between the obtained banks B is performed as shown in FIG. 4B. As the residue processing, ultraviolet (UV) radiation process in which ultraviolet rays are radiated, O2 plasma processing in which oxygen is used as the processing gas in the atmospheric ambient, hydrofluoric acid processing in which the residue is etched with a hydrofluoric acid solution, and the like are used. The embodiment employs hydrofluoric acid processing that performs contact processing for around 20 seconds with a hydrofluoric acid solution having a concentration of 0.2%, for example. By the residue processing, a bottom 35 of the film pattern formation region 34 formed between the banks B is selectively etched since the banks B function as masks. A bank material and the like remaining in the bottom are thereby removed.

Figure 4C:
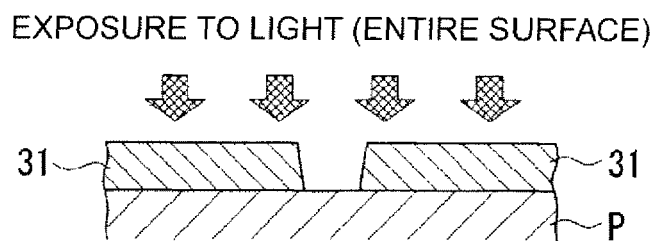

Next, the entire surface of the substrate P on which the bank B is formed is exposed to light as shown in FIG. 4C. The conditions of exposure are the same as those shown in FIG. 3C. The bank B that has not been exposed in the previous exposure process is exposed to light by this exposure of the entire surface. Part of polysilazane of which the bank B is formed is thereby hydrolyzed. Finally, a silanol (Si—OH) bond is generated and polysilazane is decomposed.

Figure 4D:
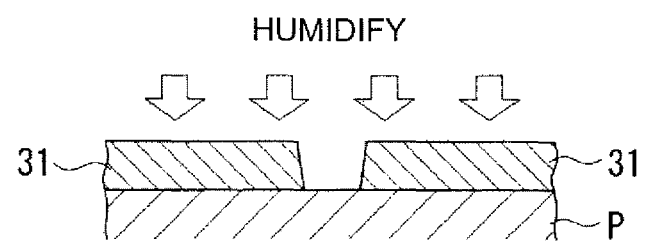
Figure 4E:
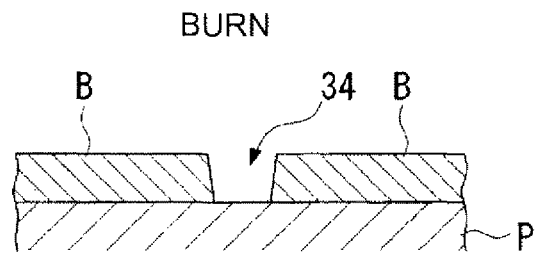

Next, humidification is performed as shown in FIG. 4D. The conditions of humidification are the same as those shown in FIG. 3D. This humidification further facilitates Si—OH bonding of polysilazane of which the bank B is formed.

Next, the film is burned by heat at a temperature of 350° C. for about 60 minutes, for example, as shown in FIG. 4D. By this burning, the bank B made of polysilazane that has SiOH bond generated by humidification easily becomes (SiOSi) as shown in the above-mentioned chemical formulas (4) to (6), to be converted to a silica-based ceramic film in which few (or no) SiNH bonds exist, for example, polymethylsiloxane.

The bank B made of polymethylsiloxane (silica-based ceramic film) is mainly composed of polysiloxane and has a methyl group, which is a hydrophobic group, as its side chain, as described above. Therefore, it has high resistance against heating, and also has good repellency by itself without, a lyophobic treatment. If it is heated at a temperature of 400° C. or more, the methyl group, the side chain, is removed from it, resulting in remarkable reduction of its repellency. Thus, the heating temperature is preferably less than 400° C., and is desirable about 350° C. or less. The humidification shown in FIGS. 3D and 4D can be omitted, depending on the kind of polysilazane liquid.

In the above-described embodiment, the bank B is formed by using a photosensitive polysilazane liquid that functions particularly as a positive photo resist. However, the invention is not limited to this if it meets the conditions that the difference between the advancing contact angle and the receding contact angle of the functional liquid with the top surface of the bank is 10 degrees or more and that the receding contact angle is 13 degrees or more. Therefore, other polysilazane liquids and other materials may be appropriately used to form the bank B.

As described above, the bank B can be formed on the substrate P and the film pattern formation region 34 partitioned by the bank B can be formed.

In the embodiment, the formed bank B has high resistance to heating since its main component is inorganic. Therefore, if a film pattern made of ink for wiring pattern X1 and X2 is burned, the film exhibits sufficient resistance without bringing disadvantages such as being molten during the burning.

A polysilazane liquid functioning as a positive photo resist secures better accuracy of patterning of the bank obtained from it. Hence, this also secures better accuracy of patterning of the film obtained from the bank, allowing the film to be preferably employed when fine wiring is formed.

The top surfaces of the banks B have lyophobicity that the difference between the advancing contact angle and the receding contact angle of ink with the discharged ink is 10 degrees or more and the receding contact angle is 13 degrees or more as shown in the example of experiment to be described later. Hence, a process of placing a functional liquid, which will be described later, is performed under the conditions that the difference between the advancing contact angle and the receding contact angle of ink with the top surface of the bank is 10 degrees or more and that the receding contact angle is 13 degrees or more. The bottom of the film pattern formation region 34 has higher wettability than that of the top surface of the bank since the substrate P made of glass is exposed on the bottom of the film pattern formation region 34.

Here, if the static contact angle of ink with the top surface of the bank is lower than a desired value, the wettability is excessively high. The ink spreads in a wet state on the bank after landing on the bank and might not smoothly flow down to the film pattern formation region 34. It is preferable that the static contact angle of ink with the top surface of the bank be 20 degrees or more. This enables the ink landing on the bank to be smoothly flowed to the film pattern formation region 34.

Placing Functional Liquid

Figure 5A:
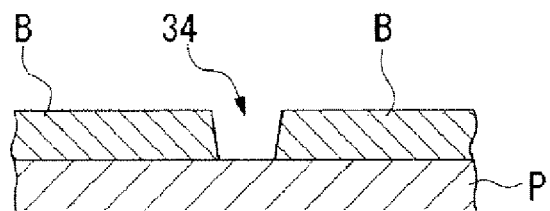
FIGS. 5A to 5D are views for explaining a method of forming a wiring pattern according to the invention in the order of processes.
Figure 5B:
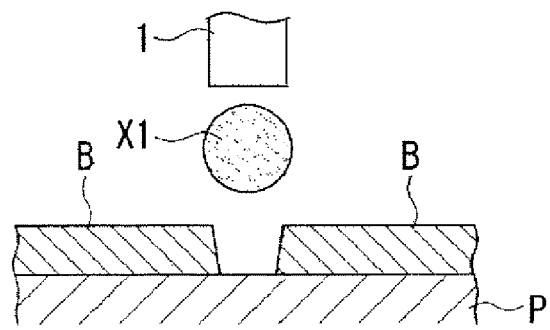
Figure 5C:
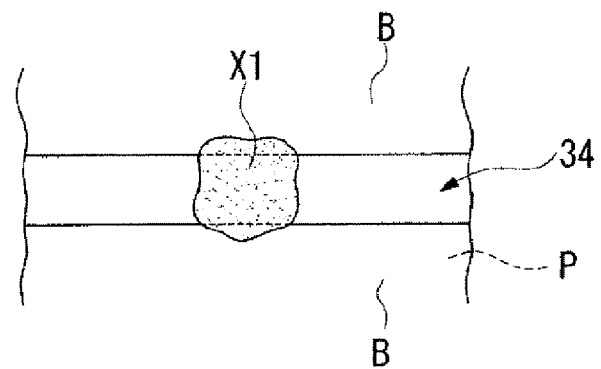
Figure 5D:
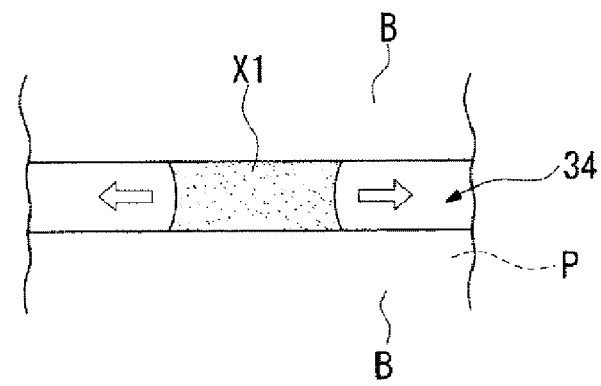

Next, a process of placing a functional liquid (ink) will be described with reference to FIGS. 5A to 5D. FIGS. 5A and 5B show side sectional views when ink is discharged in the film pattern formation region, and FIGS. 5C and 5D show plan views when ink is discharged in the film pattern formation region.

First, the ink (functional liquid) for wiring pattern X1 is discharged and placed onto the exposed substrate P in the film pattern formation region 34 between the banks B by using the droplet discharging device IJ, as shown in FIG. 5A. In the embodiment, the above-mentioned liquid containing conductive micro particles dispersed in a disperse medium such as water is used as the ink for wiring pattern X1. In the embodiment, the ink for wiring pattern X1 using, for example, chrome as the conductive micro particles is discharged. As conditions for discharging droplets, ink weight may be 4 to 7 ng/dot and ink velocity (discharging velocity) may be 5 to 7 m/sec. The ambient of disk droplets is preferably set at a temperature of 60° C. or less and a humidity of 80% or less. Such conditions allow stable droplet discharging without clogging of the discharging nozzle of the droplet discharging head 1.

In placing a functional liquid, the ink for wiring pattern X1 is discharged as droplets from the droplet discharging head 1 and the droplets are placed onto the exposed substrate P in the film pattern formation region 34 between the banks B, as shown in FIG. 5B. In the embodiment, ink is discharged under the conditions that the difference between the advancing contact angle and the receding contact angle of the ink with the top surface of the bank is 10 degrees or more and that the receding contact angle is 13 degrees or more. The static contact angle of the ink with the top surface of the bank is 20 degrees or more The ink for wiring pattern X1 is prevented from spreading beyond a predetermined position since the film pattern formation region 34 is surrounded by the bank B. However, if the diameter of the discharged droplet is larger than the width of the film pattern formation region 34, part of ink stays over the banks B as shown in FIG. 5C when ink (droplet) directly lands on the film pattern formation region 34 for forming the fine wiring.

Here, the embodiment includes the bank B that is made of polymethylsiloxane and has repellency. Therefore, if part of the discharged water-based ink for wiring pattern X1 stays on the bank B, the part of the ink is repelled from the bank B due to the repellency of the bank B. The repelled ink flows down to the film pattern formation legion 34 between the banks B. Since the ink and the top surface of the bank meet the above-described conditions of contact angle, the ink for wiring pattern X1 drops into the film pattern formation region 34 as shown in FIG. 5D without the landing trace (residue) of the ink remaining on the bank B. The discharged ink for wiring pattern X1 easily spreads on the exposed substrate P in the film pattern formation region 34 since the exposed substrate P in the film pattern formation region 34 has a lower contact angle than the top surface of the bank B as described above (the exposed substrate is provided with lyophilicity). Thus, the ink for wiring pattern X1 can be evenly placed in the extending direction of the film pattern formation region 34 between the banks B as shown in FIG. 5D.

Intermediate Drying

A predetermined amount of ink for wiring pattern X1 is discharged onto the substrate P, and thereafter the discharged ink is dried in order to remove the disperse medium if necessary. This drying solidifies the ink for wiring pattern X1 to the extent that the ink is not mixed with another kind of ink for wiring pattern that is placed on the ink for wiring pattern X1. The drying can be performed usually by using a hot plate, an electric furnace, or the like that heats the substrate, for example, and in addition may be performed by lamp annealing. Light sources used for lamp annealing are not particularly limited, but infrared lamps, xenon lamps, YAG lasers, argon lasers, carbon dioxide gas lasers, excimer lasers such as XeF, XeCl, XeBr, KrF, KrCl, ArF, and ArCl, and the like may be used as the light source. These light sources in the output range not less than 10 W nor more than 5000 W are generally used, but those in the range not less than 100 W nor more than 1000 W are sufficient for this embodiment.

Figure 6A:
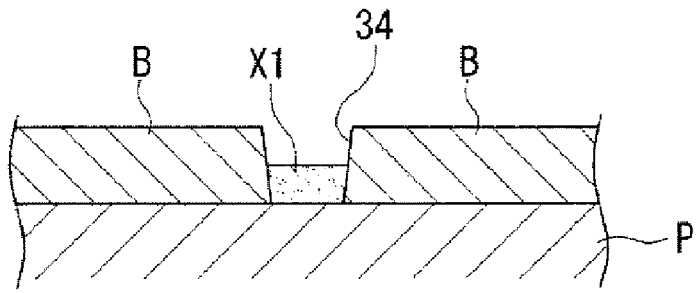
FIGS. 6A to 6C are views for explaining a method of forming a wiring pattern according to the invention in the order of processes.

A layer composed of the ink for wiring pattern X1 containing chrome as the conductive micro particles is formed in the film pattern formation region 34 on the substrate P, as shown in FIG. 6A, by this intermediate drying.

If the ink for wiring pattern X1 is not mixed with another ink for wiring pattern without removal of the disperse medium form the ink for wiring pattern X1, the intermediate drying may be omitted.

In the intermediate drying, the ink for wiring pattern X1 placed on the substrate P may be porous, depending on drying conditions. For example, heating at a temperature of 120° C. for 5 minutes or heating at a temperature of 180° C. for 60 minutes makes the ink for wiring pattern X1 porous. It is feared that if the ink for wiring pattern X1 is made porous as mentioned above, the other functional liquid (different metal) placed on the ink for wiring pattern X1 would come into the ink or wiring pattern X1, making it impossible for the layer of the ink for wiring pattern X1 to obtain desired functions. It is therefore preferable in the intermediate drying that the ink for wiring pattern X1 be dried under the drying conditions such that the ink does not become porous. For example, the ink for wiring pattern X1 can be prevented form being porous by heating at a temperature of 60° C. for about 5 minutes, heating at a temperature of 200° C. for about 60 minutes, or heating at a temperature of 250° C. for about 60 minutes.

Here, the bank B is made of a material having a hydrophobic group, and therefore exhibits repellency without a surface processing being performed. Therefore, if the bank B is dried by heat as described above, its repellency is neither lost nor remarkably reduced. Hence, if another functional liquid (ink for wiring pattern) is placed on the ink for wiring pattern X1, it is unnecessary to perform surface processing (repellent processing) for the bank B.

When the layer composed of the ink for wiring pattern X1 has been formed as described above, ink for wiring pattern including a different kind of conductive micro particles is placed on the ink for wiring pattern X1, forming a wiring pattern (film pattern) composed of different kinds of ink for wiring pattern stacked in the film pattern formation region 34. In the embodiment, water-based ink for wiring pattern X2 using silver as the conductive micro particles is placed on the ink for wiring pattern X1 as a first functional liquid. The ink for wiring pattern X2 is placed under the conditions that the difference between the advancing contact angle and the receding contact angle of the ink with the top surface of the bank is 10 degrees or more and that the receding contact angle is 13 degrees or more. The static contact angle of the ink with the top surface of the bank is preferably 20 degrees, or more.

Figure 6B:
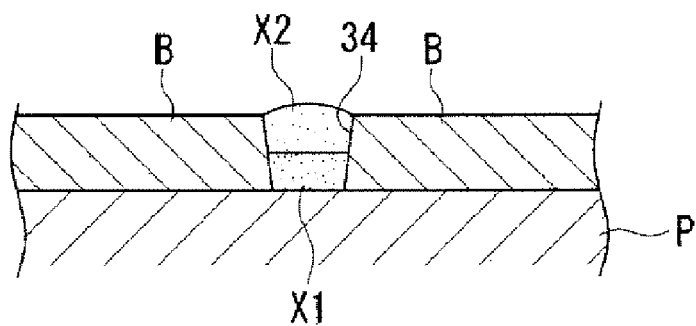

Specifically, the above-described process of placing a material is performed once again using the ink for wiring pattern X2 to place the ink for wiring pattern X2 on the ink for wiring pattern X1 as show in FIG. 6B.

Figure 6C:
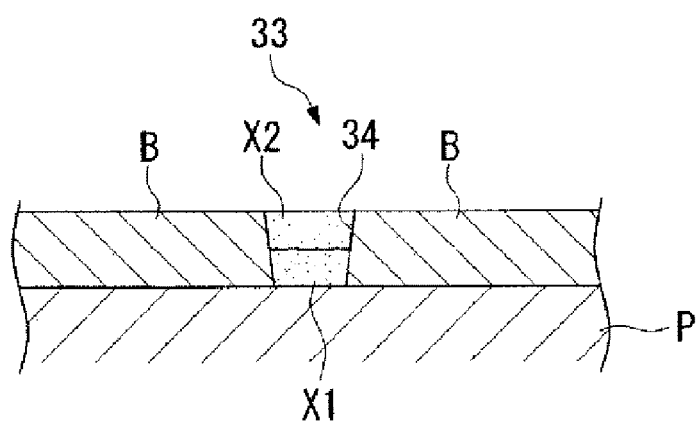

Then the above-described intermediate drying is performed once again to remove a disperse medium from the ink for wiring pattern X2 to form wiring 33 composed of the ink for wiring pattern X1 and the ink for wiring pattern X2 stacked in the film pattern formation region 34 between the banks B as in FIG. 6C.

In addition, heating treatment and/or optical treatment, which will be described later, may be performed instead of the intermediate drying for removing a disperse medium from the ink for pattern X2.

Heat Treatment/Optical Treatment

It is necessary to perfectly remove a dispersion medium from the dried film after discharging process in order to improve the electrical contact among micro particles. Further, it is necessary to remove a coating wiring material such as an organic matter, which is used for improving dispersion capability in a liquid, if the surface of the conductive micro particles is coated with the coating material. Hence, a heating treatment and/or an optical treatment is performed for the substrate P after the discharging process.

This heating treatment and/or an optical treatment is usually performed in the air, but can be performed in an inactive gas atmosphere such as nitrogen, argon, or helium if it is necessary. The temperature for heating treatment and/or an optical treatment is appropriately determined in considering the kind of atmospheric gases, pressures, thermal behaviors such as dispersion and oxidization capability of micro particles, existence or nonexistence of a coating matter, and its amount if it exists, resistance temperature of a substrate, and others. For example, burning at a temperature of about 300° C. is necessary for removing a coating material made of an organic matter. If a substrate made of plastic or the like is used, burning is preferably performed at a temperature not less than room temperature nor more than 100° C.

In the embodiment, a disperse medium and the like in the wiring 33 made of the ink for wiring pattern X1 and the ink for wiring pattern X2 are sufficiently removed particularly by heating at a temperature of 350° C. for about 60 minutes. At this point, the bank B has high resistance to heating since it has the main component that is inorganic, and also exhibits sufficient resistance during heating under the above-described conditions, bringing disadvantages such as being molten.

These above-mentioned processes can form the fine wiring 33 that includes chrome and silver stacked in the film pattern formation region 34 between the banks B.

In addition, the functional liquid may contain a material that exhibits conductivity by a heating treatment or an optical treatment, instead of conductive micro particles so that the wiring 33 exhibits the conductivity in the heating treatment and/or an optical treatment.

As described above, in the method of forming the wiring 33 (film pattern) of the embodiment, a functional liquid is placed under the conditions that the difference between the advancing contact angle and the receding contact angle of the functional liquid with the top surface of the bank is 10 degrees or more and that the receding contact angle is 13 degrees or more. As seen from the experimental result to be described later, the functional liquid can be dropped in the film pattern formation region without the landing trace of the functional liquid remaining on the bank, for example, even if the functional liquid lands on the bank. This prevents the residue of the functional liquid from remaining on the bank. Therefore, if the film pattern formed in the pattern formation region is employed as the wiring a short-circuit caused by contact between wiring adjacently located can be prevented. Thus, in the invention, a functional liquid is reliably poured into the pattern formation region, enabling a film pattern with high reliability to be formed.

The wiring made of chrome and silver stacked one over the other is formed in the film pattern formation region 34 between the banks B, and therefore silver bearing the main function of the wiring can be reliable adhered to the substrate P by means of chrome.

Second Embodiment

Figure 7:
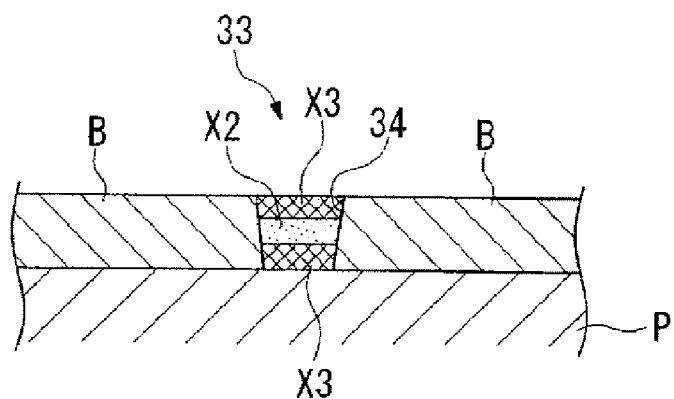
FIG. 7 is a view for explaining a second embodiment of the invention.

The wiring 33 that is different in structure from the first embodiment is explained as the second embodiment with reference to FIG. 7. In the description of the second embodiment, the differences from the first embodiment described above are explained.

In the second embodiment, the placing material process and the intermediate drying process, which have been described in the first embodiment, are repeated so that ink for wiring pattern X3 comprising titanium as the conductive micro particles and the ink for wiring pattern X2 (main material) comprising silver as the conductive micro particles are stacked in the film pattern formation region 34 as shown in FIG. 7. At this point, the ink for wiring pattern X2 and X3 are placed under the conditions that the difference between the advancing contact angle and the receding contact angle of the ink for wiring pattern X2 and X3 with the top surface of the bank B is 10 degrees or more and that the receding contact angle is 13 degrees or more.

In addition, the ink of wiring pattern X3, the ink for wiring pattern X3, and the ink for wiring pattern X3 are stacked in this order from the substrate P in the film pattern formation region 34 as shown in the figure. Namely, the ink for wiring pattern X2 is placed in the film pattern formation region 34 so as to be sandwiched between both pieces of the ink for wiring pattern X3.

The heating treatment/optical treatment described in the first embodiment is applied to the ink for wiring pattern X2 and X3, forming the wiring 33 comprising titanium, silver, and titanium stacked in this order in the film patter formation region 34.

The wiring comprising a stacked layer of titanium and silver has a property of slowing occurrence of electromigration as compared to a single layer of silver. Therefore, the wiring 33 comprising silver sandwiched by titanium as in the embodiment secures electric conductivity while slowing occurrence of electromigration. Thus, this embodiment enables the wiring 33 suppressing occurrence of electromigration to be obtained.

As the material for slowing occurrence of electromigration, iron, palladium, and platinum can be mentioned in addition to the above-mentioned titanium.

Third Embodiment

Figure 8:
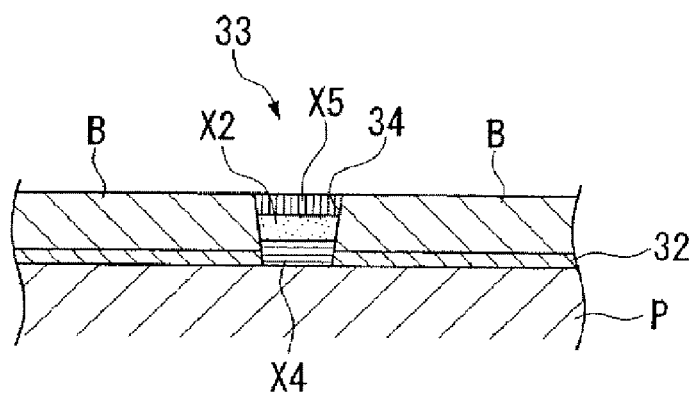
FIG. 8 is a view for explaining a third embodiment of the invention.

The wiring 33 that is different in structure from the first embodiment or the second embodiment is explained as the third embodiment with reference to FIG. 8. In the description of the third embodiment, the differences from the embodiment described above are explained.

In the third embodiment, the placing material process and the intermediate drying process, which have been described in the first embodiment are repeated so that ink for wiring pattern X4 comprising manganese as the conductive micro particles, the ink for wiring pattern X2 comprising silver as the conductive micro particles, and the ink for wiring pattern X5 comprising nickel as the conductive micro particles are stacked in this order from the substrate P in the film pattern formation region 34 as shown in FIG. 8. At this point, the ink for wiring pattern X2 and X4 are placed under the conditions that conditions that the difference between the advancing contact angle and the receding contact angle of the ink for wiring pattern X2 and X4 with the top surface of the bank B is 10 degrees or more and that the receding contact angle is 13 degrees or more.

The heating treatment/optical treatment described in the first embodiment is performed for the ink for wiring pattern X2, X4, and X5, forming the wiring 33 comprising manganese, silver, and nickel stacked in this order in the film pattern formation region 34.

In the wiring 33 having such a structure, a layer of manganese provided between a layer of silver and the substrate P improves adhesion between the silver layer and the substrate P. Nickel has a function of improving adhesion between the substrate P and the silver layer, and further has a function of suppressing deterioration of silver caused by plasma irradiation. The wiring 33 that can suppress deterioration of silver when the substrate P on which the wiring 33 is formed is irradiated with plasma can be obtained by placing a layer of nickel over a layer of silver enables.

At this point, the above-mentioned nickel may be used to function as a barrier material for suppressing diffusion of silver caused by the plasma damage.

Nickel functioning as a barrier material can prevent a leakage current from being generated by diffusion of metal ion (silver) in an interlayer insulating film if the interlayer insulating film is formed on the wiring 33.

It is to be understood that the invention is not limited to the above-described embodiments, and various changes and modifications can be made without departing from the spirit and scope of the invention. For example, in particular, ink for wiring pattern containing, conductive micro particles may applied as a first functional liquid onto the substrate P and then dried, and thereafter water-based ink containing a material having insulating characteristics may be applied onto the dried ink and then dried, forming a film pattern (wiring pattern) composed of a conductive film and an insulating film as the wiring 33.

Regarding a film pattern formed in the invention, the film pattern is formed of a plurality of functional liquids, these functional liquids may be the same material. In this case, a desired film thickness can be obtained by repeating a coating process if the desired film thickness cannot be obtained by a single coating process.

Further, a film pattern according to the invention may be formed by a single application of a functional liquid without a plurality of functional liquids being stacked. The kind of a film pattern may be an insulating pattern of the like other than a wiring pattern.

Example of Experiment

As a method of measuring the wettability of the top surface of a bank made of polymethylsiloxane to various kinds of ink (functional liquid) and dispersion liquids used therefor in the above-described embodiments, the contact angle (dynamic contact angle and static contact angle) of the top surface was investigated. Polymethylsiloxane has sufficient repellency to water-based ink since it has a methyl group as its side chain as described above. However, it is excessively lyophilic for alcohol-based dispersion liquid (1-octanol). An experiment was also carried out for the contact angle of a bank made of polymethylsiloxane, for which a lyophobic treatment by plasma processing using CF4 gas was performed, with ink.

The above-mentioned dynamic contact angle includes the advancing contact angle and the receding contact angle.

As the method of measuring the dynamic contact angle (advancing contact angle and receding contact angle) of the bank top surface (solid sample) with discharged ink (liquid sample), for example, (1) Wilhelmy method, (2) extending and contracting method (3) falling method, and other methods are known.

(1) The Wilhelmy method measures a load in the process of sinking a solid sample (material for forming a bank) into a liquid sample (ink) in a sample tank or in the process of pulling up the sunk sample and obtains the dynamic contact angle from the measured value and the value of surface area of the solid sample. The contact angle obtained in the process of sinking a solid sample is the advancing contact angle, and the contact angle obtained in the process of pulling up the solid sample is the receding contact angle.

(2) The extending and contracting method measures the contact angle between the surface of a solid sample and a droplet while forming the droplet by ejecting the liquid sample at a constant flow rate from the tip of an injection needle, a glass capillary tube, or the like onto the surface of the solid sample (material for forming a bank), thereby obtaining the advancing contact angle. Adversely, the method measures the contact angle between the surface of a solid sample and a droplet while pulling up a liquid sample (ink) of which the droplet is composed from the tip of the injection needle, a glass capillary tube, or the like, thereby obtaining the receding contact angle.

(3) In the falling method, a droplet is formed on a solid sample (material for forming a bank). The method measures the contact angle between the surface of a solid sample and a droplet while falling and moving the liquid (ink) on the solid sample, which is tilted or made upright. The contact angle located in the front of the moving direction of the liquid is the advancing contact angle, and the contact angle located in the rear of the moving direction is the receding contact angle.

However, the above-mentioned measuring methods all have drawbacks such as limited samples that can be measured. The embodiment used the following measuring method, which is a modification of the above-mentioned (2) extending and contracting method.

Figure 9A:
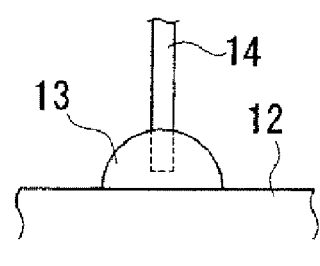
FIGS. 9A and 9B are views for explaining measurement method of a dynamic contact angle.

As shown in FIG. 9A, a solid sample 12 moves in the horizontal direction with an end of a needle-shaped tube 14 inserted in a droplet (ink) 13 that is discharged on the surface of the solid sample (bank) 12. The droplet 13 deforms as if it were dragged by the needle-shaped tube 14, as the solid sample 12 moves, as showing in FIG. 9B, due to the interfacial tension of the droplet 13 and the needle-shaped tube 14 since the needle-shaped tube 14 is inserted in the droplet 13.

The contact angle between the solid sample 12 and the droplet 13 with the droplet 13 deformed as described above depends on the surface tension of a liquid constituting the droplet 13, the surface tension of a solid constituting the solid sample 12, the interfacial tension, frictional fore, and absorbability between the liquid and the solid, the roughness of the surface of the solid, and others. Therefore, the dynamic contact angle can be obtained by measuring the contact angle in this state. Namely, the receding contact angle is obtained from contact angle $\theta 1$ located in the front of the moving direction of the solid sample 12, and the advancing contact angle is obtained from contact angle $\theta 2$ located in the rear of the moving direction.

In this dynamic contact angle, particularly the receding contact angle $\theta 1$ is an index for ease of movement of the droplet 13. Large receding contact angle $\theta 1$ indicates that the droplet 13 is easy to move, and small receding contact angle $\theta 1$ indicates that the droplet 13 is difficult to move.

Figure 9B:
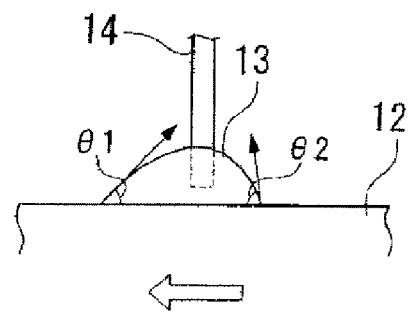

In this measurement method, the solid sample 12 is moved in the horizontal direction with the end of the needle-shaped tube inserted in the droplet on the solid sample 12. Only the dynamic contact angle as the result caused by the above-mentioned factors such as surface energy and friction can be measured without investing these factors. The method therefore allows proper measurement of the dynamic contact angle for every solid sample and liquid sample. The embodiment employs the measurement method shown in FIGS. 9A and 9B as the measurement method of the advancing contact angle and the receding contact angle. Of course, the invention may employ measurement methods other than that shown in FIGS. 9A and 9B, for example, the measurement methods (1) to (3) mentioned above. In this case, the dynamic contact angle (advancing contact angle and receding contact angle) obtained may differ between the measurement methods due to the difference of measurement devices and others. For this reason, if the measurement method other than that shown in FIGS. 9A and 9B is used, it is preferable that correlation between the measurement method and the measurement method shown in FIGS. 9A and 9B be obtained and the value (dynamic contact angle) obtained from the actual measurement be used in terms of the value (dynamic contact angle) obtained from the measurement method shown in FIGS. 9A and 9B.

FIG. 10 is a table showing this experimental result. Polymethylsiloxane and polymethylsiloxane that is provided with lyophobicity by the plasma processing using $CF_4$ gas are used as materials used for a bank used in the experiment, as described above.

Only Ag ink (water-based dispersion liquid), Ag ink (hydrocarbon-based dispersion liquid), and disperse mediums such as tetradecane ($C_{14}H_{30}$) and 1-octanol are used as the ink material. In FIG. 10, $\theta$ indicates the static contact angle with the above ink, $\theta a$ indicates the advancing contact angle with the above ink, and $\theta r$ indicates the receding contact angle with the above ink.

Figure 11A:
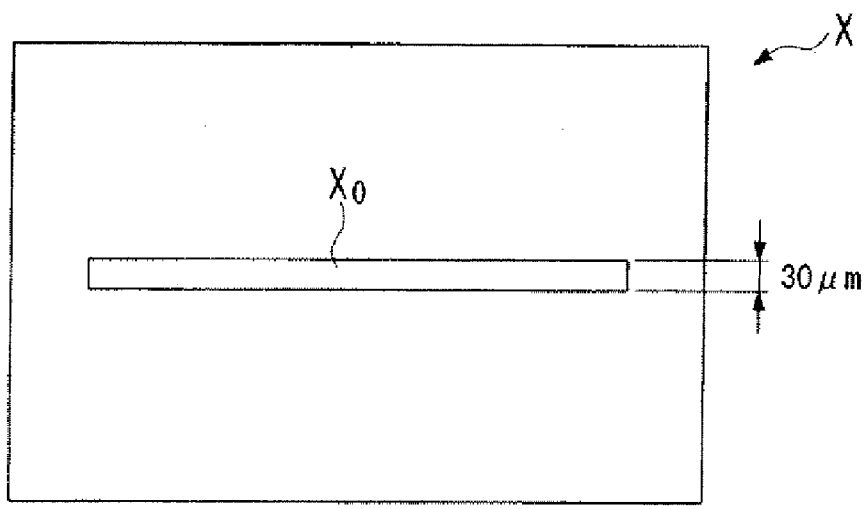
FIGS. 11A and 11B are views for explaining an experiment method.
Figure 11B:
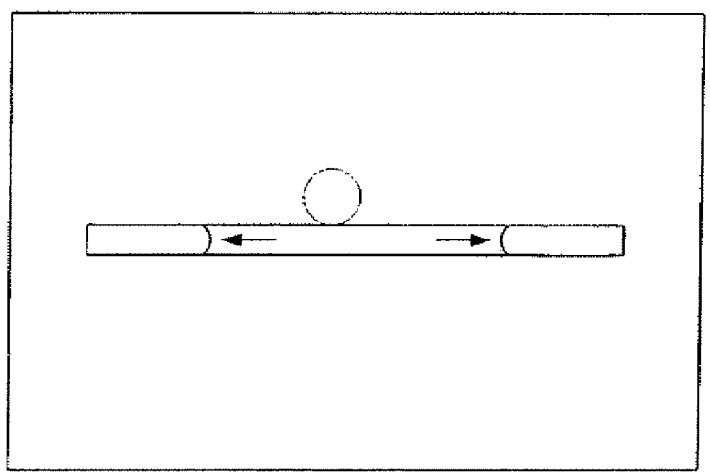

Next, the experiment method is explained. FIG. 11A shows a substrate for experiment X used in the experiment. In the substrate for experiment X, a film pattern formation region $X_0$ in a groove shape with a width of 30 μm partitioned with the bank is formed. First, as shown in FIG. 11B, each ink is placed on the bank as indicated by chain double-dashed line so as to be along the edge of the above groove-shaped film pattern formation region $X_0$, seen from the above.

The ink that has landed on the bank is fallen down into the groove-shaped film pattern formation region $X_0$. At this point, it was checked with eyes whether the landing trace (residue) of ink remained on the bank. If no landing trace of ink remained on the bank, the decision result of the case where was "possible". On the other hand, if a landing trace of ink remained on the bank, the decision result was "possible". The results shown in FIG. 10 were obtained from the above-described experiment. In addition, if the bank shown in FIG. 11 was made of polymethylsiloxane and 1-octanol was used, ink spread in a wet state on the bank upon landing on the bank, making the measurement impossible. The decision result was therefore "incapable". The reason for this is considered that the static contact angle θ of 1-octanol with the bank is 8.0, exhibiting very high lyophilicity.

According to the above-described experiment, it was confirmed that if the ink was place under the conditions that the difference between the advancing contact angle and the receding contact angle was 10 degrees or more and that the receding contact angle was 13 degrees or more, the ink discharged on the bank could be surely fallen down into the groove-shaped film pattern formation region without a landing trace remaining on the bank.

Electro Optic Device

Figure 12:
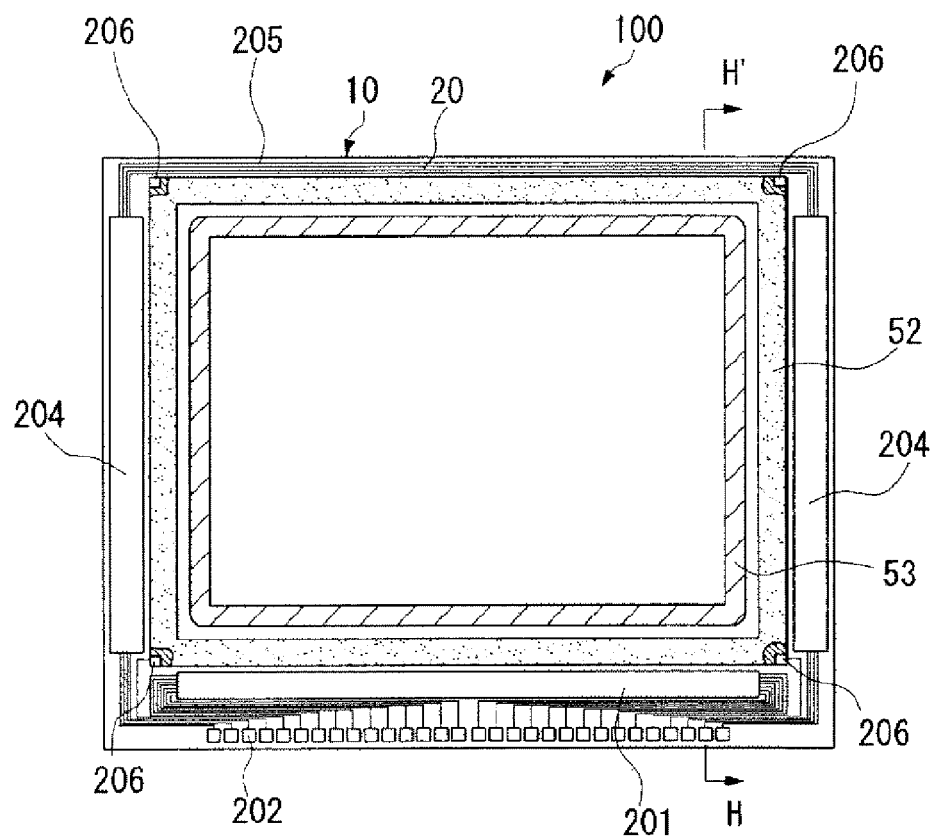
FIG. 12 is a plan view showing a liquid crystal display seen from the side of the opposing substrate.
Figure 13:
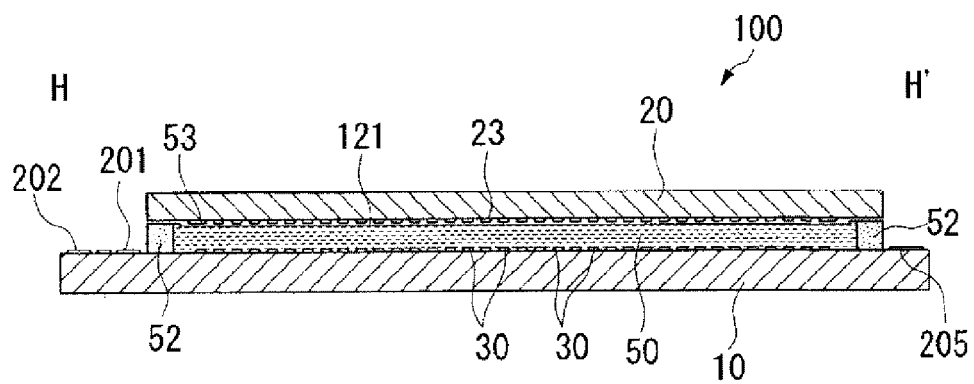
FIG. 13 is a sectional view taken along the line H-H' in FIG. 12.
Figure 14:
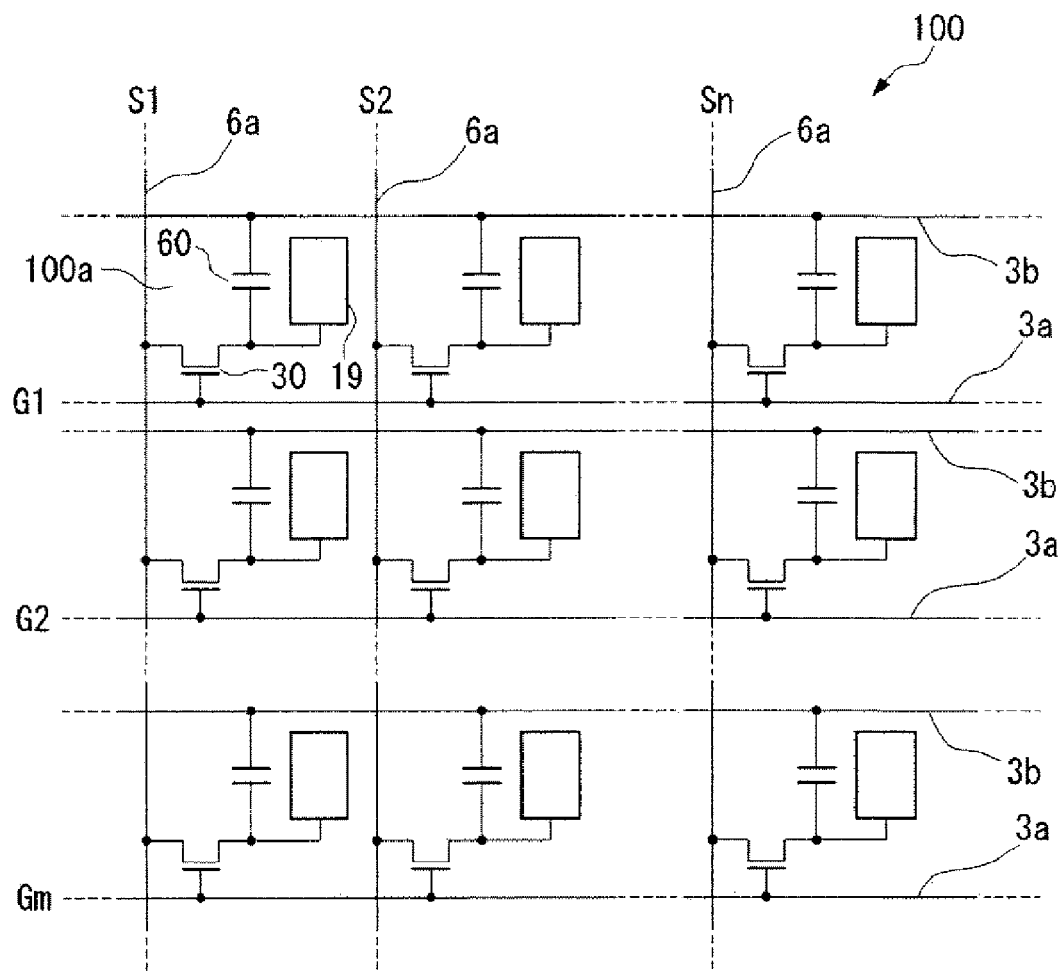
FIG. 14 is an equivalent circuit diagram showing a liquid crystal display.
Figure 15:
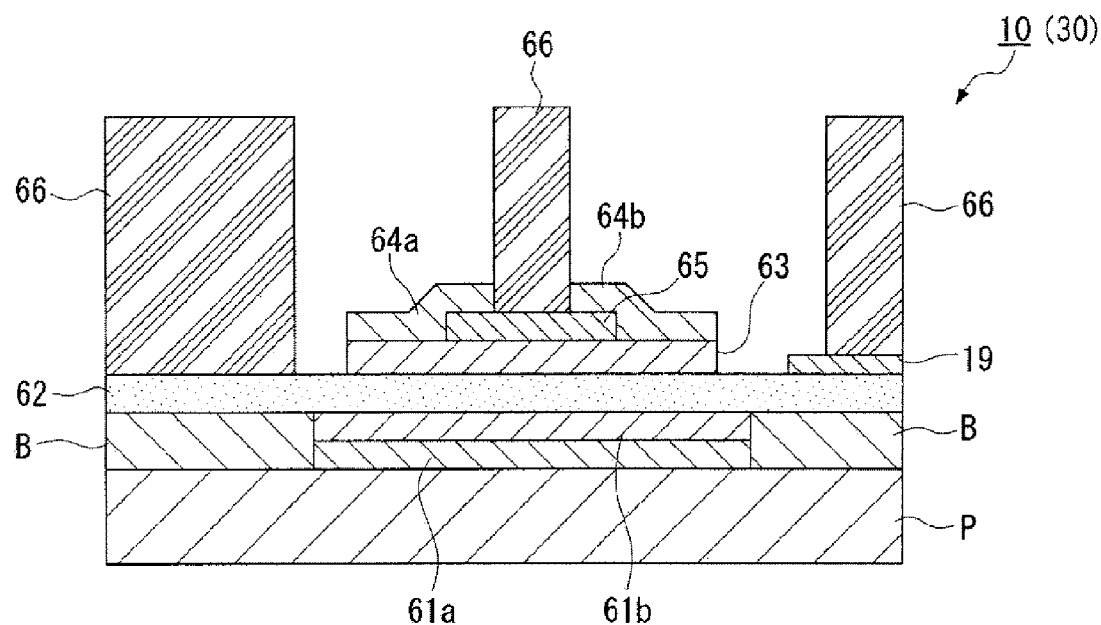
FIG. 15 is a partial enlarged view of the liquid display of FIG. 14.

Next, a liquid crystal display, which is an example of the electro optic device of the invention, is explained. FIG. 12 is a plan view showing a liquid crystal display according to the invention with its elements, seen from the side of the opposing substrate, and FIG. 13 is a sectional view taken along the line H-H' in FIG. 12. FIG. 14 is an equivalent circuit diagram showing various elements and wiring in a plurality of pixels formed in a matrix in the image display region of the liquid crystal display, and FIG. 15 is a partial enlarged view of the liquid crystal display.

In FIGS. 12 and 13, a liquid crystal display (electro optic device) 100 of the embodiment mainly comprises a thin film transistor (TFT) array substrate 10 and an opposing substrate 20, which are paired, and a sealing member 52, which is a photopolymerizing sealing member. The a TFT array substrate 10 is attached to the opposing substrate 20 by means of the sealing member 52, and liquid crystal 50 is sealed and maintained in the partitioned region by the sealing member 52. The sealing member 52 is formed in a closed frame shape in the substrate surface.

Inside the sealing member 52, the peripheral partition 53 made of a shielding material is formed. Outside the sealing member 52, a data line driving circuit 201 and a mounting terminal 202 are formed along one side of the TFT array substrate 10. A scanning line driving circuit 204 is formed along a side adjacent to this side. A plurality of pieces of wiring 205 are placed along the only remaining side of the TFT array substrate 10, and connect the scanning line driving circuits 204 placed at the both sides of the image display region. Conductive members between substrates 206 to electrically connect the TFT array substrate 10 with the opposing substrate 20 are placed at least at one of corners of the opposing substrate 20.

Instead of forming the data line driving circuit 201 and the scanning line driving circuit 204 on the TFT array substrate 10, for example, a tape automated bonding (TAB) substrate on which an LSI for driving may be mounted is electrically and mechanically connected to a group of terminals formed on the periphery of the TFT array substrate 10 through an anisotropic conductive film. In the liquid crystal display 100, a retardation film, a deflecting plate, and others are placed in a predetermined direction depending on the kind of the liquid crystal 50 used, namely, depending on the operation mode such as twisted nematic (TN) mode, C-TN method, VA system, or IPS system, or depending on whether normally white mode or normally black mode is used, which is not shown in the figure. If the liquid crystal display 10 is used for color display on the opposing substrate 20, for example, red (R), green (G), and blue (B) color filters with their protective films are formed in the regions that are opposite to pixel electrodes to be described later on the TFT array substrate 10.

In the image display region of the liquid crystal display 100 having such a structure, a plurality of pixels 100a are formed in a matrix, and a TFT (switching element) is formed in each of these pixels 100a, and a data lines 6a to supply pixel signals S1, S2, ... Sn is electrically connected to the source of a TFT 30, as shown in FIG. 14. Here, FIG. 14 shows an example of an active matrix substrate according to the invention.

Pixel signals S1, S2, ... Sn are supplied to the data line 6a in this sequential order. Otherwise, a group of these signals may be supplied to a plurality of data lines 6a adjacently located. A scanning line 3a is electrically connected to the gate of the TFT 30, which applies scanning pulse G1, G2, ... Gn to the scanning line 3a in the sequential order at a predetermined timing.

A pixel electrode 19 is electrically connected to the drain of the TFT 30. The TFT 30 as a switching element is turned on for a predetermined time, writing pixel signals S1, S2, ... Sn supplied from data lines 6a to pixel electrodes 19 at a predetermined timing. Pixel signals S1, S2, ... Sn at a predetermined level written to a liquid crystal via the pixel electrode 19 as described above are maintained between the pixel electrode 19 and an opposing electrode 121 of the opposing substrate 20 shown in FIGS. 17A to 17D. A storing capacitor 60 is arranged in parallel with liquid crystal capacitance formed between the pixel electrode 19 and the opposing electrode 121. This capacitor is provided to avoid leak of image signals written to a liquid crystal. For example, the voltage of the pixel electrode 19 is maintained in the storing capacitor 60. This tune is three digits longer than the time for application of the source voltage. Thus, the maintaining characteristics of charge improve and the liquid crystal display 100 having a high contrast ratio can be attained.

FIG. 15 is a partial enlarged view of the liquid crystal display 100 having a bottom gate type TFT 30. The bottom gate type TFT 30 shown in this figure is one embodiment of a device according to the invention. On the glass substrate P constituting the TFT array substrate 10, gate wiring 61 made of a plurality of different materials being stacked is formed by the film pattern formation method in the above-described embodiments. In the embodiment, since an inorganic bank material mainly composed of polysiloxane as described above is used in forming the gate wiring 61, the bank B can sufficiently be resistant to a temperature up to about 350° C. if heated in the process of forming an amorphous silicon layer to be described later. In the embodiment, the gate wiring 61 made of chrome 61a and silver 61b that are stacked one over the other is shown as an example.

A semiconductor layer 63 composed of an amorphous silicon (a-Si) layer is stacked on the gate wiring 61, holding a gate insulating film 62 made of SiNx therebetween. Part of the semiconductor layer 63 opposing to the above-mentioned gate wiring part is a channel region. Junction layers 64a and 64b composed of, for example, n+type a-Si layer are formed on the semiconductor layer 63 in order to obtain the ohmic junction. An insulating etch stop film 65 made of Si Nx for protecting the channel is formed on the semiconductor layer 63 at the center of the channel region. Resist coating, exposure and develop, and photoetching are applied to these gate insulating film 62, semiconductor layer 63, and etch stop film 65 after they are deposited (CVD), thereby patterning them as shown in the figure.

Further, the junction layers 64a and 64b and the pixel electrode 19 made of indium tin oxide (ITO) are similarly formed and photoetching is applied to them, thereby patterning them as shown in the figure. Banks 66 are formed on the pixel electrode 19, the gate insulating film 62, and the etch stop film 65. A source line and a drain line are formed between the banks 66 by using the above-described droplet discharging device IJ.

The gate line 61, the source line, and the drain line may be formed as wiring made of a plurality of different materials stacked so as to obtain the gate line 61, the source line, and the drain line having a plurality of functionalities.

Here, if the wiring is made of two layers of chrome and silver described in the first embodiment, the liquid crystal display 100 having improved adhesion among the gate line 61, the source line, and the drain line can be obtained. If the wiring is made of titanium, silver, display 100 having suppressed electromigration of the gate line 61, the source line, and the drain line are obtained. Further, If the wiring is made of manganese, silver, and nickel stacked in this order as explained in the third embodiment, the liquid crystal display 100 in which adhesion of the gate line 61, the source line, and the drain line is improved and deterioration of silver caused by plasma processing is suppressed can be obtained.

The TFT 30, which is one embodiment of a device according to the invention, is used as a switching element for driving the liquid crystal display 100 in the above description, but can be applied to other devices. For example, the TFT 30 can be applied to an organic electroluminescent (EL) display device. The organic EL display device comprises thin films including fluorescent inorganic or organic compounds that are sandwiched between an anode and a cathode. In the organic EL display device, electrons and holes are injected into the thin films to generate excitons. The device emits light by utilizing the emitting of light (fluorescence and phosphorescence) that is produced when the excitons recombine.

Among fluorescent materials used for the organic EL display element, materials exhibiting luminescent colors of read, green, and blue, which are namely a material for forming a light emitting layer and materials for forming a hole injection layer or an electron transport layer, are placed as the ink on the substrate having the TFT 30, and patterned. A full-color self light emitting device can thereby be manufactured.

The electro optic device according to the invention includes such an organic EL display device. According to the invention, for example, an organic EL display device with wiring having a plurality of functionalities can be provided.

Figure 16:
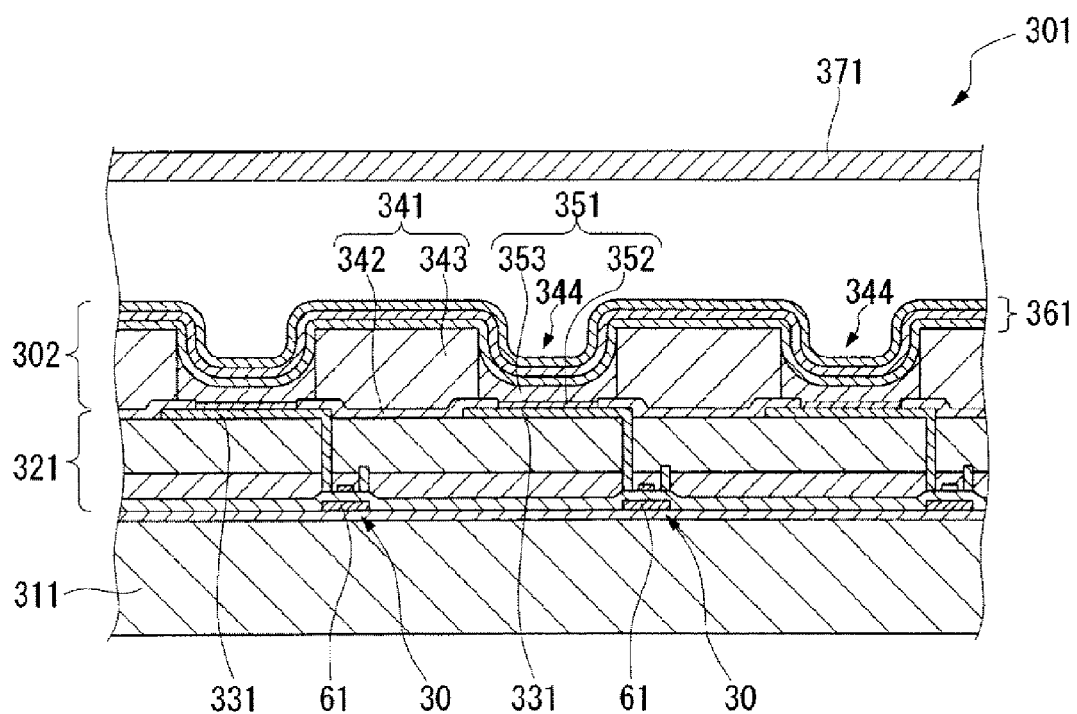
FIG. 16 is a partial enlarged view of an organic EL display device.

FIG. 16 is a side sectional view of an organic EL display in which part of elements are manufactured by the droplet discharging device IJ. The schematic structure of the organic EL display device is explained with reference to FIG. 16.

In FIG. 16, an organic EL display device 301 is an organic EL element 302 to which wiring and a driving IC (not shown) of a flexible substrate (not shown) are connected. The organic EL element 302 comprises a substrate 311, a circuit element section 321, a pixel electrode 331, a bank section 341, a light emitting element 351, a cathode 361 (opposing electrode), and a substrate for sealing 371. The circuit element section 321 is structured such that the TFTs 30 as active elements are formed on the substrate 311 and a plurality of pixel electrodes 331 are aligned on the circuit element section 321. The gate wiring 61 constituting the TFT 30 is formed by the wiring pattern formation method in the above embodiments.

The bank section 341 is formed in a lattice shape between the pixel electrodes 331, and the light emitting element 351 is formed in a concave opening 344 created by the bank section 341. The light emitting element 351 comprises an element of emitting red light, an element of emitting green light, and an element of emitting blue light, by which the organic EL display device 301 achieves the full-color display. The cathode 361 is formed on the entire surface of the bank section 341 and the light emitting element 351, and a substrate for sealing 371 is stacked on the cathode 361.

The process of manufacturing the organic EL display device 301 including an organic EL element comprises a bank section formation process for forming the bank section 341, a plasma processing process for appropriately forming the light emitting element 351, a light emitting element formation process for forming the light emitting element 351, an opposing electrode formation process for forming the cathode 361, and a sealing process for stacking the substrate for sealing 371 on the cathode 361 and sealing the element.

The light emitting element formation process forms the light emitting element 351 by forming the concave opening 344, namely, a hole injection layer 352 and a light emitting layer 353 on the pixel electrode 331, and comprises a hole injection layer formation process and a light emitting layer formation process. The hole injection layer formation process has a first discharging process of discharging a liquid material for forming the hole injection layer 352 onto the pixel electrode 331 and a first drying process of drying the discharged liquid material to form the hole injection layer 352. The light emitting layer formation process has a second discharging process of discharging a liquid material for forming the light emitting layer 353 on the hole injection layer 352 and a second drying process of drying the discharged liquid material to form the light emitting layer 353. Three kinds of the light emitting layer 353 are formed using materials corresponding to three colors of red, green, and blue as described above, and therefore the second discharging process includes three processes, each of which discharges each of three kinds of material.

In the light emitting element formation process, the droplet discharging device IJ can be used in the first discharging process of the hole injection layer formation process and the second discharging process of the light emitting layer formation process.

The gate wiring of a TFT is formed by using a film pattern formation method according to the invention in the embodiment, but other elements such as a source electrode, a drain electrode, and a pixel electrode can also be manufactured. The method of manufacturing a TFT is explained with reference to FIGS. 17A to 17D.

Figure 17A:
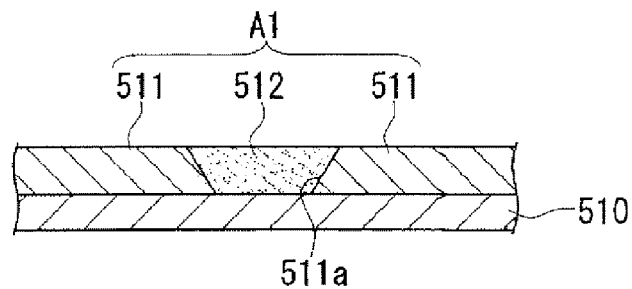
FIGS. 17A to 17D are views for explaining processes of manufacturing a thin film transistor.

As shown in FIG. 17A, a first layer of bank 511 for providing a groove 511a at ¹⁄₂₀ to ¹⁄₁₀ of one pixel pitch is formed using, for example, the above-described polysilazane liquid on the top surface of a cleaned glass substrate 510. The bank formed using polysilazane in this manner is made from an inorganic material mainly composed of polysiloxane, and therefore has repellency as described above and further has optical transparency.

In the process of forming a gate scanning electrode following the process of forming the first layer of bank, droplets of a water-based functional liquid containing a conductive material are discharged by inkjet so as to fill the inside of the groove 511a, which is a drawing region partitioned by a bank 511, forming a gate scanning electrode 512. At this point, the functional liquid is discharged under the conditions that the difference between the advancing contact angle and the receding contact angle of the functional liquid is 10 degrees or more and that the receding contact angle is 13 degrees or more. Namely, the film pattern formation method according to the invention is applied to forming the gate scanning electrode 512.

As the conductive material, Ag, Al, Au, Cu, palladium, Ni, W-si, conductive polymers, and others can be preferably employed. The gate scanning electrode 512 thus formed meets the above-mentioned conditions of the contact angle between the functional liquid and the top surface of the bank. Therefore, no landing trace of the functional liquid remains on the bank 511, allowing a fine wiring pattern without protruding from the groove 511a to be formed.

A first conductive layer A1 made of silver (Ag) having the smooth top surface comprising the bank 511 and the gate scanning electrode 512 is formed on the substrate 510 by the above-described processes.

In order to obtain good discharging results in the groove 511a, it is preferable to employ a forward tapered shape (tapered shape opening towards the discharger) as the shape of the groove 511a. This shape enables the discharged droplet to sufficiently come deep into the groove.

Figure 17B:
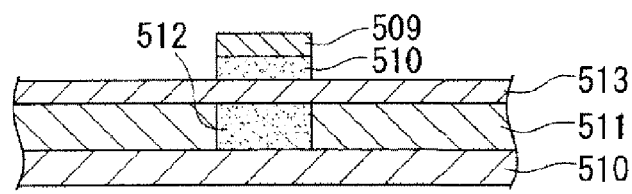

Next, a gate insulating film 513, an active layer 510, and a contact layer 509 are continuously formed by a plasma CVD method as shown in FIG. 17B. A silicon nitride film for the gate insulating 513, an amorphous silicon film for the active layer 510, and an n+ type silicon film as the contact layer 509 are formed altering the raw material gas and plasma conditions. Heat history at a temperature of 300 to 350° C. is required when the films are formed by a CVD method, but issues on transparency and heat resistance can be avoided by using an inorganic bank made from the above-mentioned polysilazane liquid.

Figure 17C:
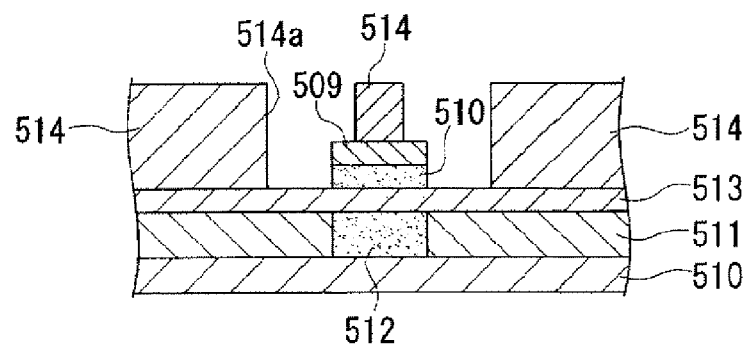

In the process of forming a second layer of bank following this process of forming a semiconductor layer; a second layer of bank 514 for providing a groove 514a that is at ⅟20 to ⅟10 of one pixel pitch and intersects the groove 511a is formed using the same polysilazane liquid as described above on the top surface of the gate insulating film 513a, as shown in FIG. 17C. The inorganic bank formed using polysilazane in this manner has repellency as described above and further has optical transparency.

Figure 17D:
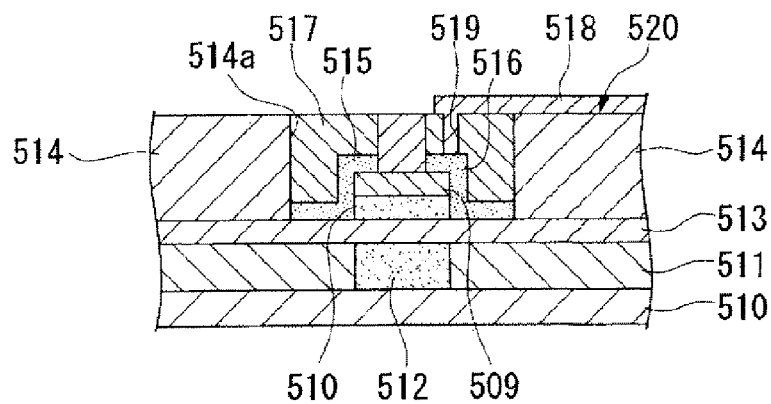

In the process of forming source and drain electrodes following the process of forming the second layer of bank, for example, droplets of a water-based functional liquid containing a conductive material are discharged by inkjet so as to fill the inside of the groove 514a, which is a drawing region partitioned by the bank 514, forming a source electrode 515 and a drain electrode 516, which intersect the gate scanning electrode 512, as shown in FIG. 17D. The film pattern formation method according to the invention is applied to forming the source electrode 515 and the drain electrode 516.

As described above, the functional liquid for forming the source electrode 515 and the drain electrode 516 is placed under the conditions that the difference between the advancing contact angle and the receding contact angle of the functional liquid with the top surface of the bank 514 is 10 degrees or more and that the receding contact angle is 13 degrees or more.

As the conductive material in the process, Ag, Al, Au, Cu, palladium, Ni, W-si, conductive polymers, and others can be preferably employed. The source electrode 515 and the drain electrode 516 thus formed meet the above-mentioned conditions of the contact angle between the functional liquid and the top surface of the bank. Therefore, no landing trace of the functional liquid remains on the bank 514, allowing a fine wiring pattern without protruding from the groove 514a to be formed.

An insulating material 517 is placed so as to fill the groove 514a in which the source electrode 515 and the drain electrode 516 are placed. A smooth top surface 520 comprising the bank 514 and the insulating material 517 is formed on the substrate 510 by the above-described processes.

A contact hole 519 is formed in the insulating material 517 and a patterned pixel electrode (ITO) 518 is formed on the top surface 520, and the drain electrode 516 is connected to the pixel electrode 518 via the contact hole 519, forming a TFT.

Figure 18:
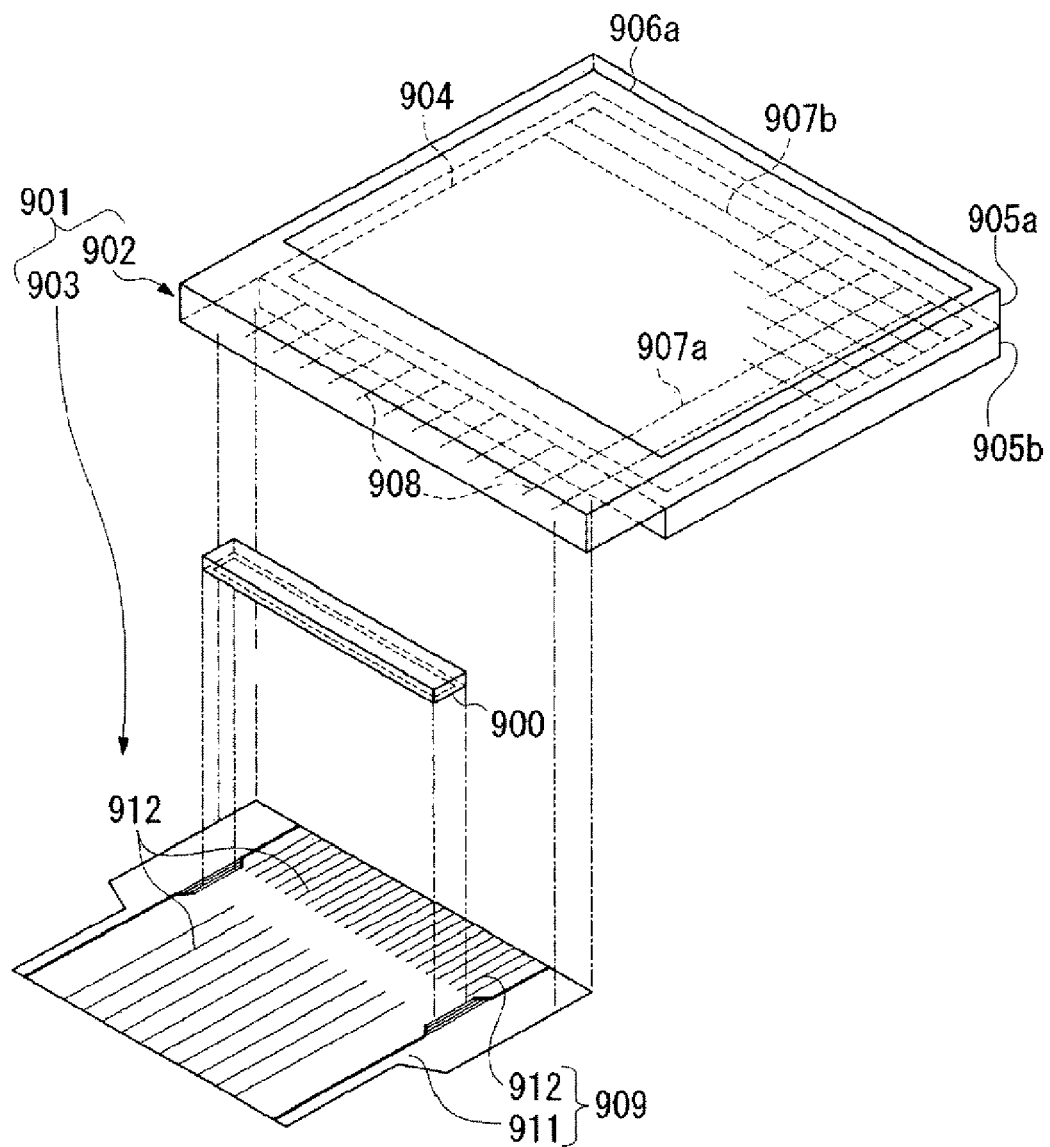
FIG. 18 is a view showing another embodiment of the liquid crystal display.

FIG. 18 is a view showing another embodiment of a liquid crystal display.

A liquid crystal display (electro optic device) 901 shown in FIG. 18 roughly comprises a color liquid crystal panel (electro optic panel) 902 and a circuit board 903 connected to the liquid crystal panel 902. A lighting system such as a backlight system and other accessory devices are attached to the liquid crystal panel 902.

The liquid crystal panel 902 has a pair of substrates 905a and 905b adhered by a sealing material 904, and liquid crystal is filled into a gap formed between the substrates 905a and 905b, so-called a cell gap. These substrates 905a and 905b are usually made of a transparent material such as glass, or a synthetic resin. Polarizing plates 906a and 906b are attached to the external surface of the substrates 905a and 905b. The polarizing plate 906b is not shown in FIG. 18.

An electrode 907a is formed on the internal surface of the substrate 905a, and an electrode 907b is formed on the internal surface of the substrate 905b. These electrodes 907a and 907b are formed in an appropriate pattern such as stripe, character, or numeral. These electrodes 907a and 907b are formed on a translucent material such as ITO. The substrate 905a has a protruding portion that protrudes for the substrate 905b, and a plurality of terminals 908 are formed on the protruding portion. These terminals 908 are formed at the same time that electrode 907a is formed on the substrate 905a. Therefore, these terminals 908 are made, for example, of ITO. These terminals 908 may extend integrally from the electrode 907a, and may be connected to the electrode 907b via a conductive material (not shown).

In the circuit board 903, a semiconductor element 900 as an IC for liquid crystal driving is mounted at a predetermined position on the wiring substrate 909. Resistors, condensers, and other chip parts, which are not shown in the figure, may be mounted at a predetermined position other than the position at which the semiconductor element 900 is mounted. A metal film such as Cu formed on a film-liked base substrate 911 having flexibility such as polyimide is patterned, forming a wiring pattern 912. Thus, the wiring substrate 909 is manufactured.

In the embodiment, electrodes 907a and 907b in the liquid crystal panel 902 and a wiring pattern 912 in the circuit board 903 are formed by the film pattern formation method of the invention. Therefore, according to a liquid crystal display of the embodiment, the liquid crystal display is excellent by itself since it is provided with a film pattern such as the wiring pattern 912 with high reliability as described above.

In addition, the above-described example is a passive type liquid crystal panel, but an active matrix type liquid crystal panel may be used. Namely, TFTs are formed on one substrate, and a pixel electrode is formed for each TFT. Wiring (gate wiring, source wiring) can be formed using an inkjet technique as described above. On the other hand, opposing electrodes and others are formed on the opposing substrate. The invention may also be applied to such an active matrix type liquid crystal panel.

Next, specific examples of an electronic apparatus of the invention are explained.

Figure 19A:
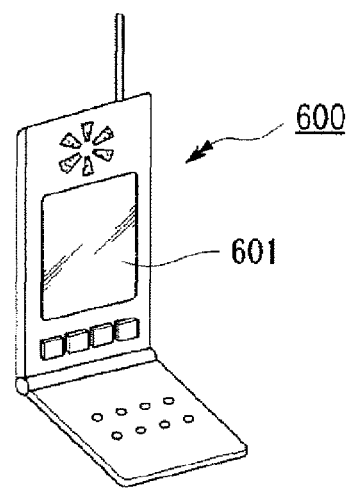
FIGS. 19A to 19C are views showing specific examples of electronic apparatuses of the invention.

FIG. 19A is a perspective view showing an example of a cellular phone. In FIG. 19A, reference numeral 600 denotes the main body of the cellular phone, and numeral 601 denotes a liquid crystal display unit with the liquid crystal display of the above embodiment.

Figure 19B:
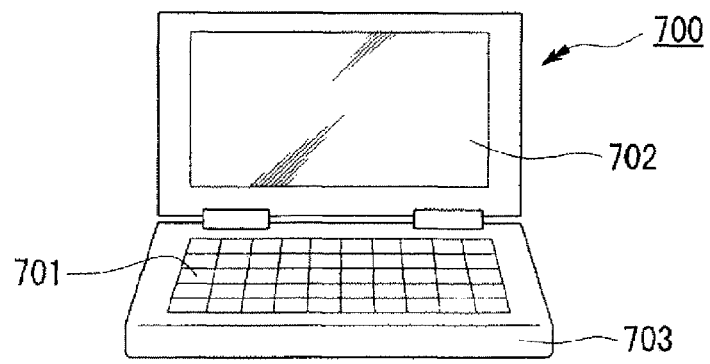

FIG. 19B is a perspective view showing an example of a portable type information processing device such as a word processor and a personal computer. In FIG. 19B, reference numeral 700 denotes and information processing device, numeral 701 denotes and input unit such as a keyboard, numeral 703 denotes the main body of the information processing device, and numeral 702 denotes a liquid crystal display unit with the liquid crystal display of the above-described embodiment.

Figure 19C:
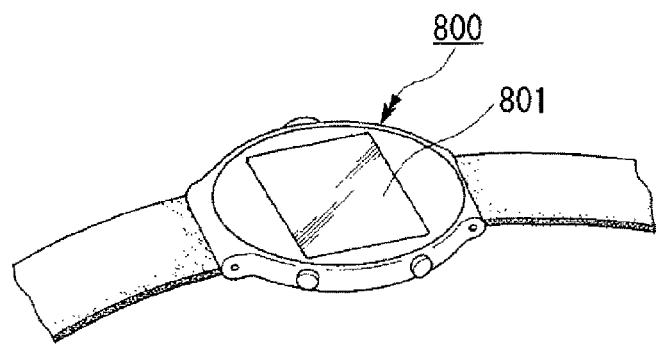

FIG. 19C is a perspective view showing an example of a wrist watch type electronic apparatus. In FIG. 19C, reference numeral 800 denotes the main body of the watch, numeral 801 denotes a liquid crystal display unit with the liquid crystal display of the above-described embodiment.

The electronic apparatuses shown in FIGS. 19A to 19C are excellent by themselves since they are provided with the liquid crystal display of the above-described embodiment.

The electronic apparatus of the embodiment is provided with a liquid crystal device, but an electronic apparatus may also be provided with another electro optic device such as an organic EL display or a plasma type display.

What is claimed is:

1. A method of forming a film pattern by placing a functional liquid on a substrate, comprising:
    forming a bank on the substrate, wherein the bank corresponds to a region for forming the film pattern;
    placing the functional liquid in the region for forming the film pattern partitioned by the bank; and
    curing the functional liquid to form the film pattern;
    wherein the functional liquid is placed under conditions that a receding contact angle of the functional liquid with a top surface of the bank is 13 degrees or more, and
    wherein the functional liquid is placed under conditions that a difference between an advancing contact angle and the receding contact angle of the functional liquid with the top surface of the bank is 10 degrees or more.

2. The method of forming a film pattern according to claim 1, wherein the functional liquid is placed under a condition that a static contact angle of the functional liquid with the top surface of the bank is 20 degrees or more.

3. The method of forming a film pattern according to claim 1, wherein a photosensitive polysilazane liquid or a photosensitive polysiloxane liquid including a photoacid generator and functioning as a positive photo resist is coated, exposed, developed, patterned, and then burned so as to form the bank made of a material mainly composed of a siloxane bond.

4. The method of forming a film pattern according to claim 1, wherein a functional material included in the functional liquid is a conductive material.

5. The method of forming a film pattern according to claim 1, wherein the functional liquid includes a main material bearing a main function of the film pattern to be formed and a material for improving adhesion between the main material and the substrate.

6. The method of forming a film pattern according to claim 1, wherein the functional liquid includes a main material bearing a main function of the film pattern to be formed and a material for suppressing electromigration of the main material.

7. The method of forming a film pattern according to claim 1, wherein the functional liquid includes a main material bearing a main function of the film pattern to be formed and a material having insulating characteristics.

8. The method of forming a film pattern according to claim 1, wherein the functional liquid includes a main material bearing a main function of the film pattern to be formed and a material for suppressing plasma damage of the main material.

9. The method of forming a film pattern according to claim 8, wherein the material for suppressing plasma damage of the main material is a barrier material for suppressing diffusion due to the plasma damage.

10. A method of forming a film pattern by placing a functional liquid on a substrate, comprising:
    forming a bank on the substrate, wherein the bank corresponds to a region for forming the film pattern;
    placing the functional liquid in the region for forming the film pattern partitioned by the bank;
    inserting an instrument into the functional liquid and moving the substrate such that the instrument drags the functional liquid such that a difference between an advancing contact angle and a receding contact angle of the functional liquid with a top surface of the bank is 10 degrees or more, wherein the functional liquid is placed under conditions that the receding contact angle of the functional liquid with the to surface of the bank is 13 degrees or more; and
    curing the functional liquid to form the film pattern.

* * * * *